US012437720B2

(12) United States Patent
Ahn et al.

(10) Patent No.: US 12,437,720 B2
(45) Date of Patent: Oct. 7, 2025

(54) GATE DRIVER CIRCUIT, DISPLAY PANEL AND DISPLAY DEVICE INCLUDING THE SAME

(71) Applicant: LG Display Co., Ltd., Seoul (KR)

(72) Inventors: Soonsung Ahn, Paju-si (KR); Chungwan Oh, Paju-si (KR); Minsoo Park, Incheon (KR)

(73) Assignee: LG Display Co., Ltd., Seoul (KR)

( * ) Notice: Subject to any disclaimer, the term of this patent is extended or adjusted under 35 U.S.C. 154(b) by 82 days.

(21) Appl. No.: 18/147,216

(22) Filed: Dec. 28, 2022

(65) Prior Publication Data

US 2023/0215381 A1 Jul. 6, 2023

(30) Foreign Application Priority Data

Dec. 31, 2021 (KR) ........................ 10-2021-0194647

(51) Int. Cl.
*G09G 3/3266* (2016.01)
*G09G 3/3275* (2016.01)
*G11C 19/28* (2006.01)

(52) U.S. Cl.
CPC ......... *G09G 3/3266* (2013.01); *G09G 3/3275* (2013.01); *G11C 19/28* (2013.01); *G09G 2310/0278* (2013.01); *G09G 2310/0286* (2013.01); *G09G 2310/08* (2013.01)

(58) Field of Classification Search
CPC ............... G09G 3/3266; G09G 3/3275; G09G 2310/0278; G09G 2310/0286; G09G 2310/08; G11C 19/28
See application file for complete search history.

(56) References Cited

U.S. PATENT DOCUMENTS 7,333,586 B2 2/2008 Jang
7,529,334 B2 5/2009 Jang
8,674,750 B2 * 3/2014 Lee ....................... H02M 3/073
327/536

(Continued)

FOREIGN PATENT DOCUMENTS

CN 1797609 A 7/2006
CN 108122538 A 6/2018

(Continued)

OTHER PUBLICATIONS

Machine translation of KR 20210085497 (Year: 2025).*

*Primary Examiner* — Michael Pervan
(74) *Attorney, Agent, or Firm* — Seed Intellectual Property Law Group LLP

(57) ABSTRACT

The disclosure relates to a display panel, a display device, and a gate driver circuit. According to an embodiment, a display panel includes a gate driver circuit in which when a display device operates at low-speed for a long time, a voltage of a Q node between an input and an output of a gate shift register in a gate driver circuit does not rise but is maintained at a value below a certain voltage. Here, potential maintaining circuit (PMC) is connected to a Q node, a Q2 node, or a vulnerable node between an input unit and an output unit of the gate shift register. The PMC maintains a potential of the Q node at a value below a selected level during a light-emitting operation for display. Thus, image quality defect due to damage to output voltage resulting from leakage and noise at an output node is prevented.

6 Claims, 13 Drawing Sheets

(56) References Cited

U.S. PATENT DOCUMENTS

| | | | | |
|---|---|---|---|---|
| 10,217,410 | B2 | 2/2019 | Moon | |
| 10,418,388 | B2 * | 9/2019 | Kim | H10K 50/805 |
| 11,270,629 | B2 * | 3/2022 | Yu | G09G 3/3266 |
| 11,315,459 | B2 | 4/2022 | Kong et al. | |
| 11,545,080 | B2 * | 1/2023 | Yu | G09G 3/3266 |
| 2011/0234652 | A1 | 9/2011 | Lee | |
| 2019/0057978 | A1 | 2/2019 | Kim et al. | |
| 2020/0043404 | A1 * | 2/2020 | Yu | G09G 3/3266 |
| 2022/0157227 | A1 * | 5/2022 | Yu | G09G 3/32 |
| 2022/0208062 | A1 | 6/2022 | Kong et al. | |

FOREIGN PATENT DOCUMENTS

| | | | | | |
|---|---|---|---|---|---|
| CN | 109559669 | A | | 4/2019 | |
| JP | 2020021072 | A | * | 2/2020 | G09G 3/32 |
| KR | 20110106686 | A | | 9/2011 | |
| KR | 20190018982 | A | | 2/2019 | |
| KR | 20190069182 | A | | 6/2019 | |
| KR | 20210049618 | A | | 5/2021 | |
| KR | 20210085497 | A | * | 7/2021 | |

* cited by examiner

GATE DRIVER CIRCUIT, DISPLAY PANEL AND DISPLAY DEVICE INCLUDING THE SAME

CROSS-REFERENCE TO RELATED APPLICATION

This application claims a benefit under 35 U.S.C. § 119(a) of Korean Patent Application No. 10-2021-0194647 filed on Dec. 31, 2021, in the Korean Intellectual Property Office, the entire disclosure of which is incorporated herein by reference for all purposes.

BACKGROUND

Technical Field

The present disclosure relates to a gate driver circuit, a display panel and a display device including the same in which when the display panel emits light for display, a voltage of a Q node in a gate shift register of a gate driver circuit for applying a scan signal to the display panel of the display device does not rise and is maintained in a stable manner.

Description of the Related Art

A display device may include pixels, each pixel having a light-emitting element and a pixel circuit for operating the light-emitting element.

For example, the pixel circuit includes a driving transistor that controls a driving current flowing through the light-emitting element, and at least one switching transistor that controls (or programs) a gate-source voltage of the driving transistor based on a gate signal (scan signal).

The switching transistor of the pixel circuit may be switched based on a gate signal output from a gate driver circuit (for example, a GIP (gate in panel) driver circuit) disposed on a substrate of the display panel.

In the display device, the gate driver circuit includes multiple stage circuits. Each stage circuit includes multiple shift registers to generate the gate signal (scan signal).

BRIEF SUMMARY

In a display device such as a liquid crystal display (LCD) or an organic light-emitting display (OLED), a GIP circuit that uses an output Q node structure controls a voltage of the Q node structurally through a pass transistor.

A connection point between the pass transistor and the output is the Q node, and a connection point between the pass transistor and an input is a Q2 node. A low-level voltage is input from the input to the Q2 node and then is transferred to the output through the Q node.

However, when the display panel has operated at low-speed for a long time, the voltage of the Q node rises during a skip frame, and an output voltage at an output node is damaged due to leakage and noise, thereby causing image quality defect.

Accordingly, in order to solve the above-described problem, the applicants of the present disclosure have invented a gate driver circuit in which the voltage of the Q node between an input and an output of the gate shift register in the gate driver circuit does not rise but is maintained at a value below a certain voltage.

Further, the applicants of the present disclosure have invented a display device including a gate driver circuit in which potential maintaining means is connected to a Q node or a Q2 node or a vulnerable node between the input and the output of the gate shift register, and the potential maintaining means maintains the voltage of the Q node at a voltage value below a selected (or predefined) level during a light-emitting operation for display, thereby preventing image quality defect resulting from the damage to the output voltage due to leakage and noise at the output node.

Purposes according to the present disclosure are not limited to the above-mentioned purpose. Other purposes and advantages according to the present disclosure that are not mentioned may be understood based on following descriptions, and may be more clearly understood according to embodiments according to the present disclosure. Further, it will be easily understood that the purposes and advantages according to the present disclosure may be realized using means shown in the claims and combinations thereof.

A gate driver circuit according to an embodiment of the present disclosure may be provided. In the gate driver circuit, potential maintaining means is connected to a Q node between an input unit and an output unit of each gate shift register, and this potential maintaining means operates based on a driving signal Vr so as to maintain the potential of the Q node at a value below a selected (or predefined) level.

The term "potential maintaining means" used throughout the present disclosure is a term that refers to a circuit that provides the voltage potential to a particular node. Thus, the term "potential" means the voltage potential, namely, the voltage level at that node. The term "potential" is used alone herein at various places for a shorthand reference, but refers in each instance as the voltage level. It is used herein interchangeably with the term "potential maintaining circuit" and "voltage potential circuit." The voltage potential maintaining means may include any electrical circuitry, features, components, an assembly of electronic components or the like configured to perform the various operations of the potential maintaining features as described herein. In some embodiments, the potential maintaining means may be included in or otherwise implemented by processing circuitry such as a microprocessor, microcontroller, integrated circuit, chip, microchip or the like.

Further, a display device according to an embodiment of the present disclosure may be provided. The display device may include a display panel including multiple gate lines; a gate driver circuit in which a potential maintaining means is connected to a Q node between an input unit and an output unit of the gate shift register, and the potential maintaining means operates based on a driving signal Vr so as to maintain the potential of the Q node at a value below a selected (or predefined) level; a data driver circuit for applying a data signal to the display panel; and a timing controller for controlling the gate driver circuit and the data driver circuit.

According to an embodiment of the present disclosure, in the display device, the gate driver circuit is disposed at one side of the display panel, or a plurality of gate driver circuits are respectively disposed at both opposing sides of the display panel, and the potential maintaining means to maintain the Q node voltage is disposed between the input of the shift register and the output of the shift register of the gate driver circuit.

Further, according to an embodiment of the present disclosure, additional charges may be supplied through the voltage potential maintaining means disposed between the input and the output of the shift register, such that the Q node has a wider voltage range than that of a logic voltage.

Further, according to an embodiment of the present disclosure, even when the low-speed operation may be maintained for a long time, the voltage potential maintaining means may maintain the voltage of the Q node at a value below a selected (or predefined) level Further, according to an embodiment of the present disclosure, the potential maintaining means may be connected to the Q node, thereby maintaining the voltage of the Q node at a value below a selected (or predefined) level, thereby compensating for leakage discharge and improving reliability of low-speed operation.

Further, according to an embodiment of the present disclosure, when the potential maintaining means is connected to the QB node, a gate voltage of a thin-film transistor may be further lowered, thereby achieving robustness of high voltage output.

Further, according to an embodiment of the present disclosure, the potential maintaining means is connected to the QB node, thereby strengthening a driving force for high voltage output without an additional increase in a TR size.

Further, according to an embodiment of the present disclosure, charges of an appropriate polarity may be additionally supplied to a node that has been in a floating state for a long time through the potential maintaining means.

Further, according to an embodiment of the present disclosure, when the display panel operates at low-speed for a long time, the voltage of the Q node does not rise and is kept at a value below a selected (or predefined) level during the skip frame, thereby preventing the damage to the output voltage and image quality defect caused by leakage and noise at the output node.

Further, according to an embodiment of the present disclosure, each shift register of the gate driver circuit has the voltage potential maintaining means, thereby achieving improved reliability and thus a cost reduction, and achieving robustness of high voltage output and strengthening the driving force and thus a reduction of a GIP area.

According to an embodiment of the present disclosure, a gate driver circuit for a display panel, being composed of a gate shift register; wherein the gate shift register is configured to supply a gate signal to multiple gate lines of the display panel based on multiple gate control signals provided from a timing controller of the display panel; the gate shift register includes multiple stages which are connected to each other in a dependent manner; each of the multiple stages includes: an input unit connected to each of a start signal line and a clock signal line; a Q node controller connected to the input unit through a Q2 node; an output unit connected to the Q node controller through a Q node; potential maintaining means connected to the Q node; and a QB node controller having one side connected to the output unit through a QB node and the other side connected to the output unit through a gate-off signal line, wherein the potential maintaining means is configured to operate based on a driving signal so as to maintain a potential of the Q node at a value below a selected (or predefined) level.

Effects of the present disclosure are not limited to the above-mentioned effects, and other effects as not mentioned will be clearly understood by those skilled in the art from following descriptions.

In addition to the above-described effects, specific effects of the present disclosure will be described together while describing specific details for carrying out the present disclosure below.

DETAILED DESCRIPTIONS

Figure 1:
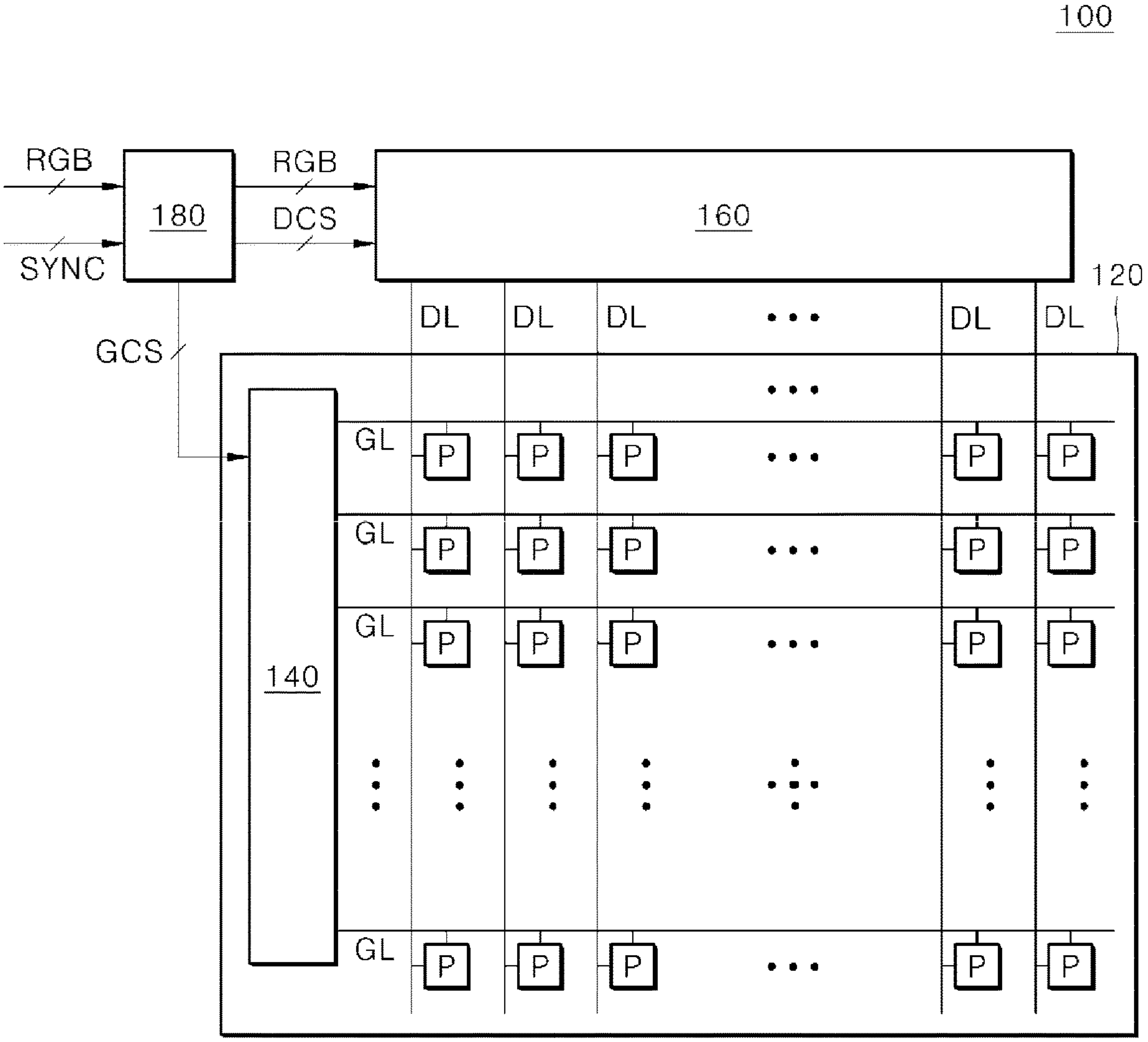
FIG. 1 is a schematic diagram showing an overall configuration of a display device having a gate shift register according to the present disclosure.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be within the spirit and scope of the present disclosure.

A shape, a size, a ratio, an angle, a number, etc., disclosed in the drawings for describing embodiments of the present disclosure are illustrative, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to limit the present disclosure. As used herein, the singular may constitute "a" and "an" are intended to include the plural may constitute as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entirety of list of elements and may not modify the individual elements of the list. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The features of the various embodiments of the present disclosure may be partially or entirely combined with each other, and may be technically associated with each other or operate with each other. An embodiments may be implemented independently of each other and may be implemented together in an association relationship.

In interpreting a numerical value in the disclosure, an error range may be inherent even when there is no separate explicit description thereof.

In a description of a signal flow relationship, for example, when a signal is transmitted from a node A to a node B, the signal may be transmitted from the node A through a node C to the node B, unless an indication that the signal is transmitted directly from the node A to the node B is specified.

In accordance with the present disclosure, each of a sub-pixel circuit and a gate driver circuit formed on a substrate of a display panel may be embodied as a transistor of an n-type MOSFET structure. However, the disclosure is not limited thereto. Each of a sub-pixel circuit and a gate driver circuit formed on a substrate of a display panel may be embodied as a transistor of a p-type MOSFET structure. A transistor may include a gate, a source, and a drain. In the transistor, carriers may flow from the source to the drain. In an n-type transistor, the carrier is an electron and thus a source voltage may be lower than a drain voltage so that electrons may flow from the source to the drain. In an n-type transistor, electrons flow from the source to the drain. A current direction is a direction from the drain to the source. In a p-type transistor, the carrier is a hole. Thus, the source voltage may be higher than the drain voltage so that holes may flow from the source to the drain. In the p-type transistor, the holes flow from the source to the drain. Thus, a direction of current is a direction from the source to the drain. In the transistor of the MOSFET structure, the source and the drain may not be fixed, but may be changed based on an applied voltage. Accordingly, in the present disclosure, one of the source and the drain is referred to as a first source/drain electrode, and the other of the source and the drain is referred to as a second source/drain electrode.

Hereinafter, a preferred example of a gate driver circuit and a display device including the same according to the present disclosure will be described in detail with reference to the accompanying drawings. Across different drawings, the same elements may have the same reference numerals. Moreover, each of scales of components shown in the accompanying drawings is shown to be different from an actual scale for convenience of description. Thus, each of scales of components is not limited to a scale shown in the drawings.

Hereinafter, a gate driver circuit according to an embodiment of the present disclosure and a display device including the same will be described.

Figure 2:
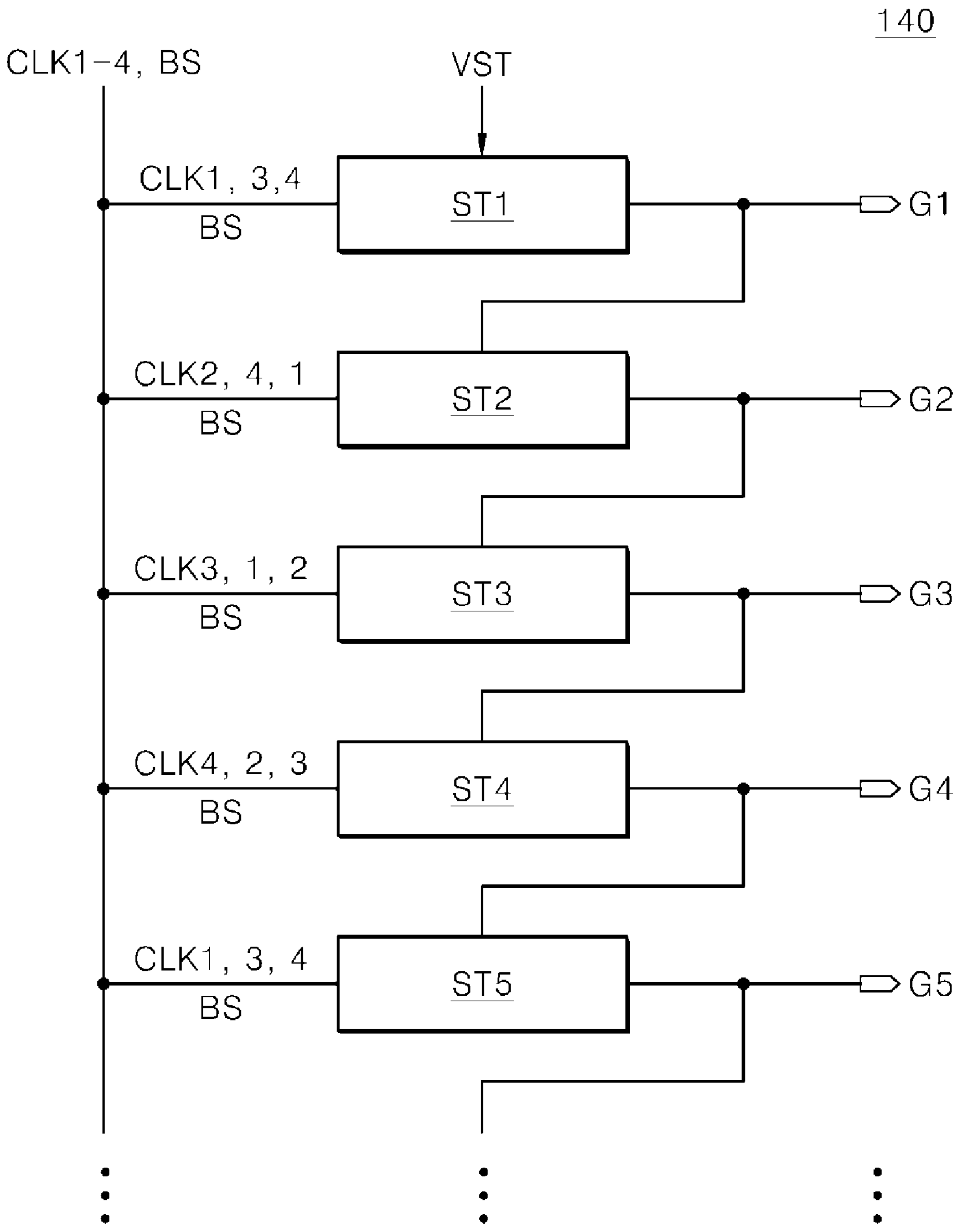
FIG. 2 is a block diagram of the gate shift register constituting a gate driver circuit as shown in FIG. 1.

FIG. 1 is a configuration diagram schematically showing an overall configuration of a display device having a gate shift register of the present disclosure, and FIG. 2 is a configuration diagram of the gate shift register constituting a gate driver circuit as shown in FIG. 1.

Referring to FIG. 1, a display device 100 according to an embodiment of the present disclosure may include a display panel 120, a gate driver circuit 140, a data driver circuit 160, and a timing controller 180.

The display panel 120 may include an OLED panel that emits light through an organic light emitting diode (OLED) element to display an image or a liquid crystal panel that displays an image through a liquid crystal (LCD) element.

In the display panel 120, a plurality of gate lines GL and a plurality of data lines DL may intersect in a matrix form and may be arranged on a substrate made of glass, and each of a plurality of pixels P may be defined at each of intersections between the plurality of gate lines GL and the plurality of data lines DL.

Each pixel P displays an image based on an image signal (data voltage) supplied from the data line DL in response to a scan signal supplied from the gate line GL.

Each pixel may include a thin-film transistor TFT and a storage capacitor Cst. All pixels may constitute a single display area A/A. An area in which no pixel is defined may be a non-display area N/A.

The display panel 120 may include the plurality of pixels P respectively defined at intersections between the gate lines GLs and the data lines DLs. Each of the plurality of pixels P according to one example may be a red pixel, a green pixel, or a blue pixel. In this case, a red pixel, a green pixel, and a blue pixel adjacent to teach other may constitute a single unit pixel. According to another example, each of the plurality of pixels P may be a red pixel, a green pixel, a blue pixel, or a white pixel. In this case, a red pixel, a green pixel, a blue pixel, and a white pixel adjacent to each other may constitute a single unit pixel for displaying a single color image.

Further, the display panel 120 may include the display area A/A, the non-display area N/A, and a bending area.

The display area A/A may include the plurality of gate lines GLs, the plurality of data lines DLs, a plurality of reference lines (not shown), and the plurality of pixels P.

A display mode of the display panel 120 may sequentially display an input image and a black image having a predetermined time difference therebetween on a plurality of horizontal lines. The display mode according to one example may include an image display period (or a light-emission display period) for displaying the input image, and a black display period (or an impulse non-light-emission period) for displaying the black image.

A sensing mode (or a real-time sensing mode) of the display panel 120 may sense operation characteristics of each of the pixels P arranged in a single horizontal line among a plurality of horizontal lines after the image display period within one frame.

Then, the sensing mode may update a pixel-based compensation value for compensating for a variation in the operation characteristic of a corresponding pixel P based on a sensed value.

The sensing mode according to one example may sense the operation characteristics of each of the pixels P arrange in a single horizontal line among a plurality of horizontal lines according to an irregular sequence within a vertical blank period of each frame. The pixels P that are emitting light according to the display mode do not emit light in the sensing mode. Thus, when sequentially sensing the horizontal lines in the sensing mode, line dim may occur in the horizontal line being sensed due to the non-light emission thereof. To the contrary, when sensing the horizontal lines in an irregular or random sequence in the sensing mode, the line dim may be minimized or prevented due to a visual spreading effect.

The gate driver circuit 140 may be implemented as, for example, a GIP (gate in panel type) gate driver. The gate driver circuit 140 may be disposed in the non-display area of the display panel 120.

The gate driver circuit 140 is composed of a gate shift register that supplies a scan signal (gate signal) to multiple gate lines GLs based on multiple gate control signals GCS provided from the timing controller 180.

The multiple gate control signals GCS includes multiple clock signals CLK1 to CLK4 having different phases and a gate start signal VST instructing start of an operation of the gate driver circuit 140. The gate shift register will be described in detail later with reference to FIG. 2.

The data driver circuit 160 converts digital image data RGB input from the timing controller 180 into a data voltage using a reference gamma voltage, and supplies the converted data voltage to the multiple data lines DLs. This data driver circuit 160 is controlled based on multiple data control signals DCS provided from the timing controller 180.

That is, the data driver circuit 160 may selectively convert modulation image data RGBv in a digital form input thereto in response to the data control signal DCS input from the timing controller 180 into data voltage VDATA in an analog form, based on a reference voltage Vref and may supply the converted data voltage to the multiple data lines DLs. The data voltage VDATA may be latched on one horizontal line basis and may be simultaneously input to the display panel 120 through all data lines DLs during one horizontal period 1H.

The timing controller 180 may receive an image signal RGB as transmitted from an external system, and timing signals such as a clock signal CLK, a horizontal synchronization signal Hsync, a vertical synchronization signal Vsync, and a data enable signal DE, and may generate a control signal to control the data driver circuit 160 and the gate driver circuit 140 based on the received signals.

In this regard, the horizontal sync signal Hsync refers to a signal representing a time it takes to display one horizontal line of a screen, and the vertical sync signal Vsync refers to a signal representing a time it takes to display a screen of one frame. Further, the data enable signal DE refers to a signal indicating a period for which a data voltage is supplied to the pixel P defined in the display panel 120.

Further, the timing controller 180 may generate the gate control signal GCS to control the gate driver circuit 140 and the data control signal DCS to control the data driver circuit 160 in synchronization with the input timing signals.

In addition, the timing controller 180 may generate a plurality of clock signals CLK 1 to CLK four that determine an operation timing of each of stages of the gate driver circuit 140, and may provide the plurality of clock signals CLK 1 to CLK four to the gate driver circuit 140. In this regard, each of the first to fourth clock signals CLK 1 to CLK four has a high period which lasts for two horizontal periods (2H). Temporarily adjacent ones of the first to fourth clock signals CLK 1 to CLK four may overlap each other by one horizontal period (1H).

Moreover, the timing controller 180 may align and modulate the received image data RGB DATA into a form that the data driver circuit 160 may process and output the modulated data. In this regard, the aligned image data RGBv may have a form to which a color coordinate correction algorithm for image quality improvement is applied.

The gate driver circuit 140 may supply the scan signal to each of the gate lines GLs.

The gate driver circuit 140 may include a first gate driver and a second gate driver respectively disposed at left and right sides of the display panel 120.

The gate driver circuit 140 may include two gate drivers, that is, the first gate driver and the second gate driver which may be respectively disposed on both opposing sides of the display panel 120 and in the non-display area N/A.

In one example, the first gate driver may be disposed on one side (let side) of the display panel 120 and the second gate driver may be disposed on the opposite side (right side) of the display panel 120.

In this regard, in the gate driver circuit 140, an odd-numbered output line of the first gate driver may be connected to an even-numbered output line of the second gate driver 140*b*, while an even-numbered output line of the first gate driver may be connected to an odd-numbered output line of the second gate driver.

Each of the first and second gate drivers may include at least one stage, preferably, a plurality of stages, each stage including a shift register. The gate driver circuit 140 may be embedded in the non-display area and in a form of a thin-film pattern and in a gate-in-panel (GIP) manner during a manufacturing process of a substrate of the display panel 120.

The gate driver circuit 140 may alternately output a gate high voltage VGH every two horizontal periods (2H) through the plurality of gate lines GLs formed on the display panel 120 in response to the gate control signal GCS input from the timing controller 180. In this regard, the output the gate high voltage VGH may be maintained for the two horizontal periods (2H). Temporarily adjacent the gate high voltages VGH may overlap each other by one horizontal period (1H). This is intended for pre-charging the gate lines GLs. Thus, more stable pixel charging may be performed upon application of the data voltage.

To this end, the first and third clock signals CLK1 and CLK3, each having the two horizontal periods (2H), may be applied to the first gate driver, while the second and fourth clock signals CLK2 and CLK4 having 2, each having the two horizontal periods (2H), may be applied to the second gate driver. In this regard, the second and fourth clock signals CLK2 and CLK4 may respectively overlap the first and third clock signals CLK1 and CLK3 for one horizontal period (1H).

In one example, the first gate driver may output the gate high voltage VGH to an n-th gate line GLn. Then, after one horizontal period (1H), the second gate driver may output the gate high voltage VGH to an (n+1)-th gate line GLn+1.

Next, after one horizontal period (1H), the first gate driver may output the gate high voltage VGH to an (n+2)-th gate line GLn+2. At the same time, the first gate driver may output a gate low voltage VGL to the n-th gate line GLn to turn off a thin-film transistor TFT so that a data voltage charged in the storage capacitor Cst is maintained for one frame.

In particular, in an embodiment of the present disclosure, a discharging circuit may be activated at a time-point at which a voltage of the gate line GL is switched from the gate high voltage VGH to the low voltage VGL to minimize a discharge delay of the gate line GL.

In this regard, each discharging circuit may be connected to a distal end of each of the gate lines GLs. Thus, R (right) discharging circuits respectively connected to odd-number-th gate lines may be disposed adjacent to the second gate driver. L (left) discharging circuits respectively connected to even-number-th gate lines may be disposed adjacent to the first gate driver.

In this regard, each of the discharging circuits may be connected to a gate line second subsequent to a single gate line GL and may apply the gate low voltage VGL to the corresponding gate line GL.

Each of these discharging circuits may be embodied as a thin-film transistor between adjacent ones of stages constituting the gate driver circuit 140. Thus, a narrow bezel in which a size of a portion of the non-display area N/A of the display panel 120 in which each of the first and second gate drivers is disposed may be realized.

Referring to FIG. 2, the gate driver circuit 140 according to an embodiment of the present disclosure is composed of a gate shift register. The gate shift register may include multiple stages ST1, ST2, . . . , STn which are connected to each other in a dependent manner.

The multiple stages ST may be selectively connected to lines to which multiple clock signals CLK1 to CLK4 are supplied, and may sequentially output scan pulses G: G1, G2, G3, . . . as the gate signal thereto.

Specifically, each of the multiple stages ST may receive at least one selected from the multiple clock signals CLK1 to CLK4, a gate on voltage VGL, a gate-off voltage VGH, and a blank signal BS.

The multiple clock signals CLK1 to CLK4 may include clock signals of 4 phases that are shifted and output by a certain period, that is, the first to fourth clock signals CLK1 to CLK4. Three clock signals may be selected from the first to fourth clock signals CLK1 to CLK4 and may be supplied to each stage ST. For example, the first, third, and fourth clock signals CLK1, CLK3, and CLK4 are supplied to each of (4k−3)-th stages ST1, ST5, ST9, . . . , where k is a natural number. The second, fourth, and first clock signals CLK2, CLK4, and CLK1 are supplied to each of (4k−2)-th stages ST2, ST6, ST10, . . . . The third, first, and second clock signals CLK3, CLK1, and CLK2 are supplied to (4k−1)-th stages ST3, ST7, ST11, . . . . The fourth, second, and third clock signals CLK4, CLK2, and CLK3 are supplied to 4k-th stages ST4, ST8, ST12, . . . .

The blank signal BS may be provided for the blank period and may be a source output enable signal SOE provided from the timing controller 180. In this regard, the blank period refers to a period set after a scan period for which the scan pulse G is output from the multiple stages ST once.

In particular, the gate shift register according to the present disclosure charges voltage of a QB node to which a gate electrode of a pull-down transistor disposed in each stage ST is connected to the gate-off voltage VGH using the blank signal BS provided for the blank period. Accordingly, the gate shift register according to the present disclosure may prevent a malfunction of the pull-down transistor PD due to leakage current of the QB node and multi-output resulting therefrom, thereby improving operation reliability.

In one example, the gate shift register according to an embodiment of the present disclosure may include a front dummy stage circuitry (not shown in FIG. 2) in front of the first stage ST1, and a rear dummy stage circuitry (not shown in FIG. 2) in rear of the n-th stage STn.

The gate driver circuit 140 may receive the gate control signal GCS through a gate control signal line. That is, the gate control signal line receives the gate control signal GCS supplied from the timing controller 180. The gate control signal line according to an example may include a gate start signal line, a first reset signal line, a second reset signal line, a plurality of gate driving clock lines, a display panel on signal line, and a sensing preparation signal line.

The gate start signal line may receive a gate start signal VST supplied from the timing controller 180. For example, the gate start signal line may be connected to the front dummy stage circuitry.

The first reset signal line may receive a first reset signal supplied from the timing controller 180. The second reset signal line may receive a second reset signal supplied from the timing controller 180. For example, each of the first and second reset signal lines may be commonly connected to the front dummy stage circuitry, the first to m-th stage circuits ST1 to STm, and the rear dummy stage circuitry.

The plurality of gate driving clock lines may include a plurality of carry clock lines, a plurality of scan clock lines, and a plurality of sense clock lines respectively receiving a plurality of carry shift clocks, a plurality of scan shift clocks, and a plurality of sense shift clocks supplied from the timing controller 180. The plurality of gate driving clock lines may be selectively connected to the front dummy stage circuitry, the first to m-th stage circuits ST1 to STm, and the rear dummy stage circuitry.

The display panel on signal line may receive a display panel on signal supplied from the timing controller 180. For example, the display panel on signal line may be commonly connected to the front dummy stage circuitry and the first to m-th stage circuits ST1 to STm.

The sensing preparation signal line may receive a line sensing preparation signal supplied from the timing controller 180. For example, the sensing preparation signal line may be commonly connected to the first to m-th stage circuits ST1 to STm. Optionally, the sensing preparation signal line may be additionally connected to the front dummy stage circuitry.

The gate driving voltage line may include first to fourth gate high-potential voltage lines for respectively receiving first to fourth gate high-potential voltages having different voltage levels from a power supply circuit, and first to third gate low-potential voltage lines for respectively receiving first to third gate low-potential voltages having different voltage levels from the power supply circuit first.

According to an example, the first gate high-potential voltage may have a higher voltage level than that of the second gate high-potential voltage. The third and fourth gate high-potential voltages may swing, in an opposite direction, between a high voltage (or a TFT on voltage or a first voltage) and a low voltage (or a TFT off voltage or a second voltage) or may be inverted to each other for alternate current (AC) operation. For example, when the third gate high-potential voltage (or an odd-numbered gate high-potential voltage) has a high voltage, the fourth gate high-potential voltage (or an even-numbered gate high-potential voltage) may have a low voltage. Then, when the third gate high-potential voltage has a low voltage, the fourth gate high-potential voltage may have a high voltage.

Each of the first and second gate high-potential voltage lines may be commonly connected to the first to m-th stage circuits ST1 to STm, the front dummy stage circuitry and the rear dummy stage circuitry.

The third gate high-potential voltage line may be commonly connected to an odd-numbered stage circuit among the first to m-th stage circuits ST1 to STm and may be commonly connected to an odd-numbered dummy stage circuit of each of the front dummy stage circuitry and the rear dummy stage circuitry.

The fourth gate high-potential voltage line may be commonly connected to an even-numbered stage circuit among the first to m-th stage circuits ST1 to STm, and may be commonly connected to an even-numbered dummy stage circuit of each of the front dummy stage circuitry and the rear dummy stage circuitry.

According to an example, the first gate low-potential voltage and the second gate low-potential voltage may have substantially the same voltage level. The third gate low-potential voltage may have a TFT off voltage level. The first gate low-potential voltage may have a higher voltage level than that of the third gate low-potential voltage. According to an example of the present disclosure, the first gate low-potential voltage may be set to have a higher voltage level than that of the third gate low-potential voltage, thereby reliably blocking an off current of a TFT having a gate electrode connected to a control node of a stage circuit to be described later. Thus, stability and reliability of an operation of the corresponding TFT may be secured.

Each of the first to third gate low-potential voltage lines may be commonly connected to the first to m-th stage circuits ST1 to STm.

The front dummy stage circuitry may sequentially generate a plurality of front carry signals in response to the gate start signal VST supplied from the timing controller 180 and supply the generated signal as a front carry signal or a gate start signal to one of the stages in rear thereof.

The rear dummy stage circuitry may sequentially generate a plurality of rear carry signals and supply the generated signal as a rear carry signal (or a stage reset signal) to one of the stages in front thereof.

The first to m-th stage circuits ST1 to STm may be connected to each other in a dependent manner. The first to m-th stage circuits ST1 to STm may respectively generate first to m-th scan signals SC1 to SCm and first to m-th sense signals SE1 to SEm and output the generated signals respectively to corresponding gate lines GL disposed in the display panel 120. Moreover, each of the first to m-th stage circuits ST1 to STm may generate each of first to m-th carry signals CS1 to CSm and supply the generated signal as a front carry signal (or a gate start signal) to one of the stages in rear thereof, and at the same time, supply the generated signal as a rear carry signal (or a stage reset signal) to one of the stages in front thereof.

Two adjacent stages of the first to m-th stage circuits ST1 to STm may share a portion of a sensing control circuit and a control node with each other. Thus, a circuit configuration of the gate driver circuit 140 may be simplified, and an area occupied by the gate driver circuit 140 in the display panel 120 may be reduced.

Figure 3:
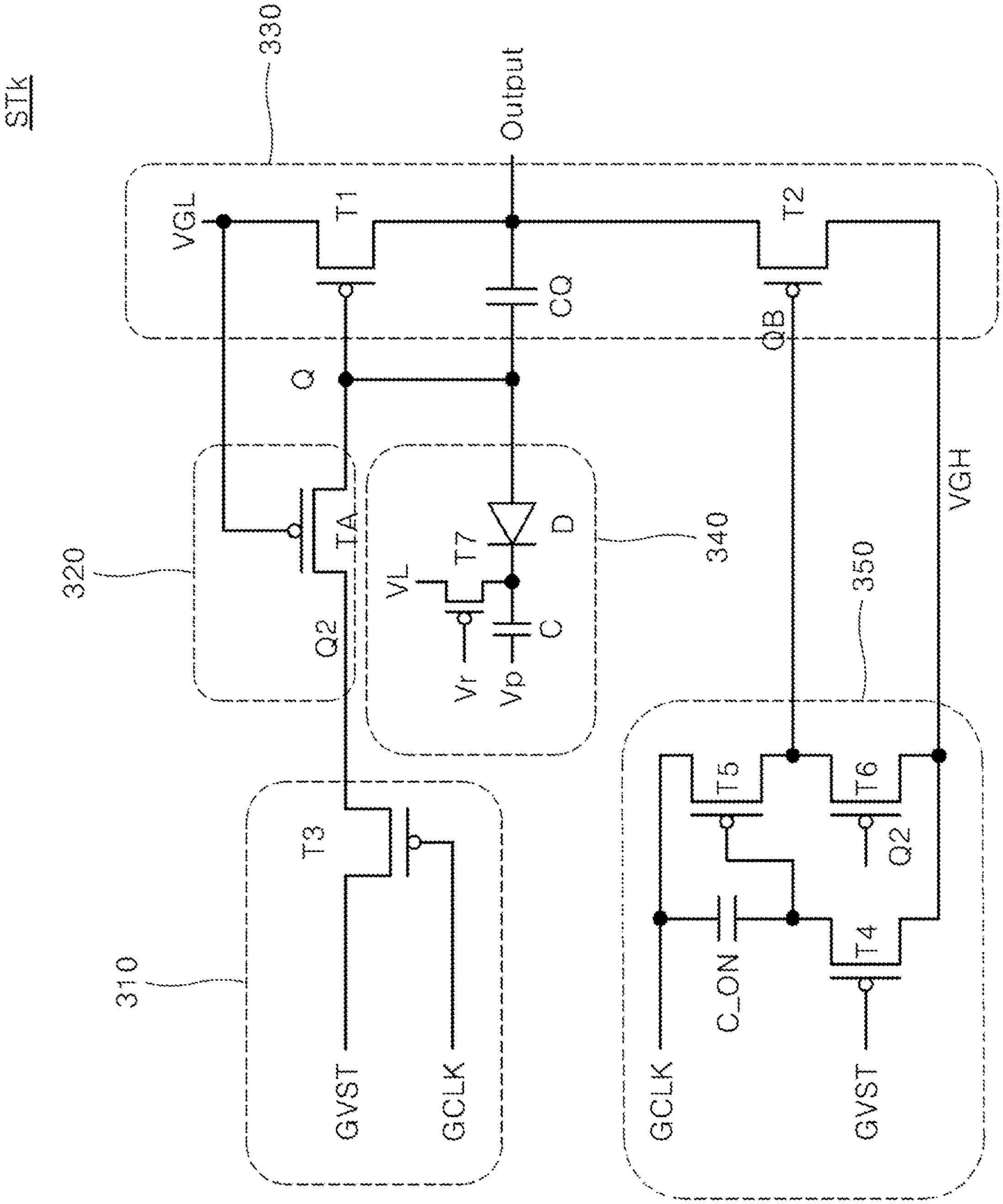
FIG. 3 is a configuration circuit diagram of any k-th stage STk in a gate shift register of a gate driver circuit according to a first embodiment of the present disclosure.

FIG. 3 is a configuration circuit diagram of any k-th stage STk in a gate shift register of a gate driver circuit according to a first embodiment of the present disclosure.

Referring to FIG. 3, in the gate shift register according to an embodiment of the present disclosure, a k-th stage STk may include an input unit 310, a Q node controller 320, an output unit 330, first voltage potential maintaining circuit 340 (also referred to as "first potential maintaining means 340"), and a first QB node controller 350.

The input unit 310 is connected to each of a start signal (GVST) line and a clock signal (GCLK) line.

The Q node controller 320 is connected to the input unit 310 through a Q2 node.

The output unit 330 is connected to the Q node controller 320 through a Q node.

The first potential maintaining means 340 is connected to the Q node.

One side of the first QB node controller 350 is connected to the output unit 330 through the QB node, and the other side thereof is connected to the output unit 330 through a gate-off signal (VGH) line.

The first voltage potential maintaining means 340 operates based on a driving signal Vr so as to maintain a voltage potential of the Q node at a value below a selected (or predefined) level.

The input unit 310 includes a third thin-film transistor T3. A gate electrode of the third thin-film transistor T3 is connected to the clock signal (GCLK) line, a first electrode thereof is connected to the start signal (GVST) line, and a second electrode thereof is connected to the Q2 node.

The input unit 310 may operate based on one clock signal GCLK among multiple clock signals CLK1 to CLK4 so as to input a start signal GVST of a high level or a low level to the second node Q2.

The Q node controller 320 includes a TFT active-Anti-backflow (TA) thin-film transistor TA. A gate electrode of the TA thin-film transistor TA is connected to a gate-on signal (VGL) line, a first electrode thereof is connected to the Q node, and a second electrode thereof is connected to the Q2 node. The TA thin film transistor TA operates as shown in Table 1 below.

TABLE 1

| Q2 Input Voltage(Vi) | Q Save Voltage(Vs) | TA On/Off | Note |
|---|---|---|---|
| H | Vs > L + Vth | ON | Wiring Mode |
| H | Vs < L + Vth | ON | Wiring Mode |
| L | Vs > L + Vth | ON | Wiring Mode |
| L | Vs < L + Vth | OFF | Anti-backflow Mode |

The Q node controller 320 is turned on when a gate-on signal (VGL) is applied to the gate electrode of the TA thin-film transistor TA. Thus, a Q2 node voltage of the second electrode is transferred to the Q node of the first electrode through the TA thin-film transistor TA such that a voltage of the Q node is controlled.

The output unit 330 includes a pull-up transistor and a pull-down transistor. The pull-up transistor outputs a scan signal to an output terminal Output based on the voltage level of the Q node. The pull-down transistor supplies a gate-off signal (VGH) to the output terminal Output based on a voltage level of the QB node.

The pull-up transistor may include a first thin-film transistor T1 in which a gate electrode thereof is connected to the Q node, a first electrode thereof is connected to a first gate-on signal (VGL) line, and a second electrode thereof is connected to the output terminal Output.

The pull-down transistor may include a second thin-film transistor T2 in which a gate electrode thereof is connected to the QB node, a first electrode thereof is connected to the output terminal Output, and a second electrode thereof is connected to a gate-off signal (VGH) line.

In this regard, a first capacitor CQ may be connected to and disposed between the Q node to which the gate electrode of the first thin-film transistor T1 is connected and the output terminal Output to which the second electrode of the first thin-film transistor T1 is connected.

The first potential maintaining means 340 may include a seventh thin-film transistor T7. A gate electrode of the seventh thin-film transistor T7 is connected to a driving signal (Vr) line, a first electrode thereof is connected to a low signal (VL) line, and a second electrode thereof is connected to a contact point between the Q node and the first capacitor CQ. Further, the first potential maintaining means 340 further includes a diode D connected to and disposed between the contact point between the Q node and the first capacitor CQ and the second electrode of the seventh thin-film transistor T7, and a second capacitor C connected to the second electrode of seventh thin-film transistor T7. An application signal (Vp) line is connected to the second electrode of seventh thin-film transistor T7 through the second capacitor C.

The first QB node controller 350 may include a fourth thin-film transistor T4, a fifth thin-film transistor T5, and a sixth thin-film transistor T6.

A gate electrode of the fourth thin-film transistor T4 is connected to the start signal (GVST) line, a first electrode thereof is connected to a gate electrode of the fifth thin-film transistor T5, and a second electrode thereof is connected to the output unit 330 through the gate-off signal (VGH) line.

A first electrode of the fifth thin-film transistor T5 is connected to the clock signal (GCLK) line, a gate electrode thereof is connected to the clock signal (GCLK) line through a third capacitor C_ON, and a second electrode thereof is connected to the QB node.

A gate electrode of the sixth thin-film transistor T6 is connected to the Q2 node, a first electrode thereof is connected to the QB node, and a second electrode thereof is connected to the output unit 330 through the gate-off signal (VGH) line.

Each of the TA transistor TA and the first thin-film transistor T1 to the seventh thin-film transistor T7 may have a P-type MOS structure.

Each of the TA transistor TA and the first thin-film transistor T1 to the seventh thin-film transistor T7 may be embodied as an oxide thin-film transistor (Oxide TFT) or a low temperature poly silicon thin-film transistor (LTPS TFT).

Figure 4:
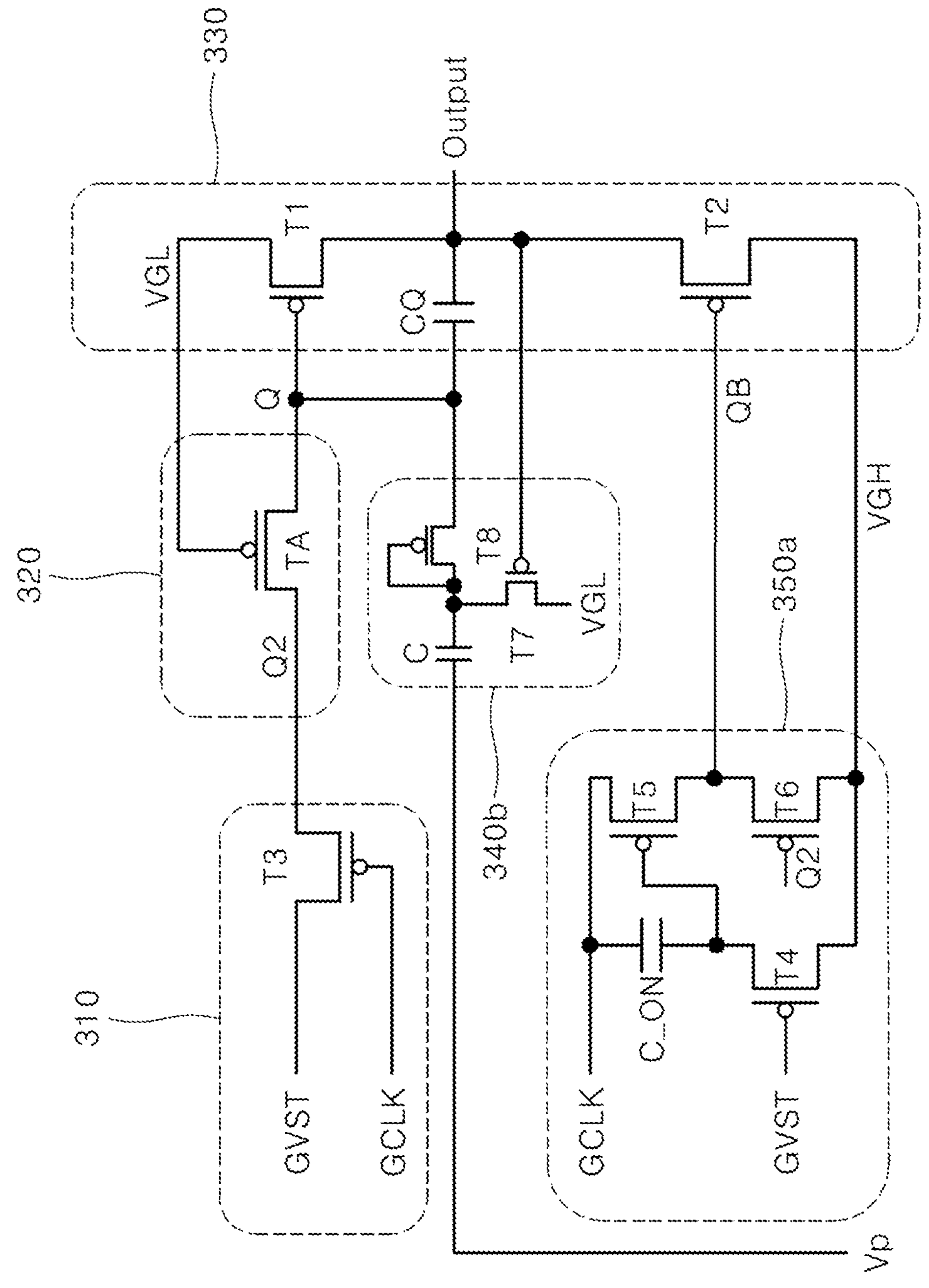
FIG. 4 is a configuration circuit diagram of any k-th stage STk in a gate shift register of a gate driver circuit according to a second embodiment of the present disclosure.

FIG. 4 is a configuration circuit diagram of any k-th stage STk in a gate shift register of a gate driver circuit according to a second embodiment of the present disclosure.

Referring to FIG. 4, in the gate shift register according to the second embodiment of the present disclosure, a k-th stage STk may include the input unit 310, the Q node controller 320, the output unit 330, second potential maintaining circuit 340*b* (also referred to as "second potential maintaining means 340*b*"), and the first QB node controller 350.

That is, in the k-th stage STk in the gate shift register according to the second embodiment of the present disclosure, the first potential maintaining means 340 is replaced with the second potential maintaining means 340*b*.

The second potential maintaining means 340*b* includes the seventh thin-film transistor T7 and an eighth thin-film transistor T8.

A first electrode of the eighth thin-film transistor T8 is connected to the Q node, a second electrode thereof is connected to the application signal (Vp) line through the second capacitor C, and a gate electrode thereof is connected to the second electrode.

A first electrode of the seventh thin-film transistor T7 is connected to the second electrode of the eighth thin-film transistor T8, a second electrode thereof is connected to the gate-on signal (VGL) line, and a gate electrode thereof is connected to the output terminal Output.

Figure 5:
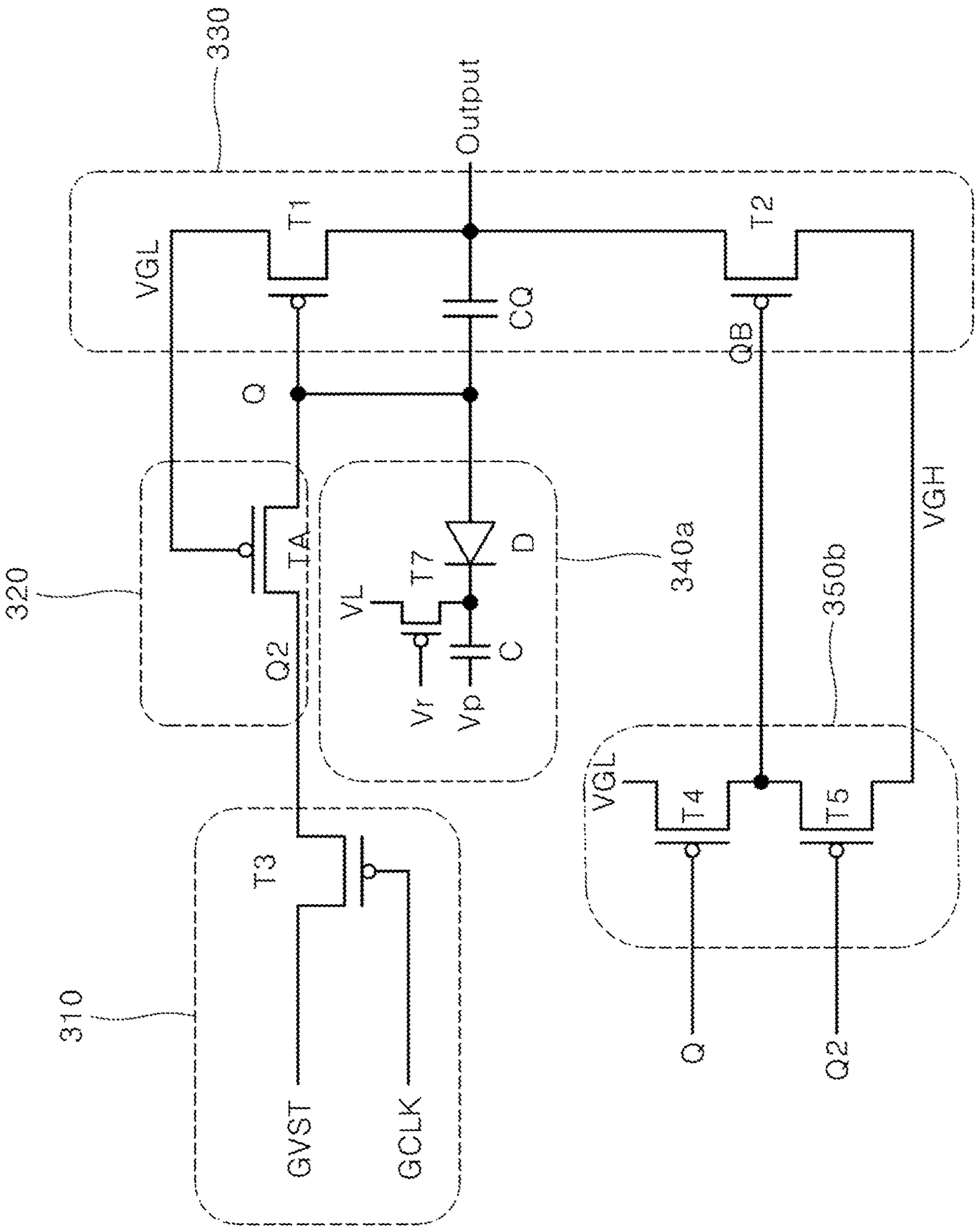
FIG. 5 is a configuration circuit diagram of any k-th stage STk in a gate shift register of a gate driver circuit according to a third embodiment of the present disclosure.

FIG. 5 is a configuration circuit diagram of any k-th stage STk in a gate shift register according to a third embodiment of the present disclosure.

Referring to FIG. 5, a k-th stage STk in the gate shift register according to the third embodiment of the present disclosure may include the input unit 310, the Q node controller 320, the output unit 330, the first potential maintaining means 340, and a second QB node controller 350*b*.

That is, in the k-th stage STk in the gate shift register according to the third embodiment of the present disclosure, the first QB node controller 350 is replaced with the second QB node controller 350*b*.

The second QB node controller 350*b* may include a fourth thin-film transistor T4 and a fifth thin-film transistor T5.

A first electrode of the fourth thin-film transistor T4 is connected to the gate-on signal (VGL) line, a second electrode thereof is connected to the QB node, and a gate electrode thereof is connected to the Q node.

A first electrode of the fifth thin-film transistor T5 is connected to the QB node, a second electrode thereof is connected to the output terminal Output through the gate-off signal (VGH) line, and a gate electrode thereof is connected to the Q2 node.

Figure 6:
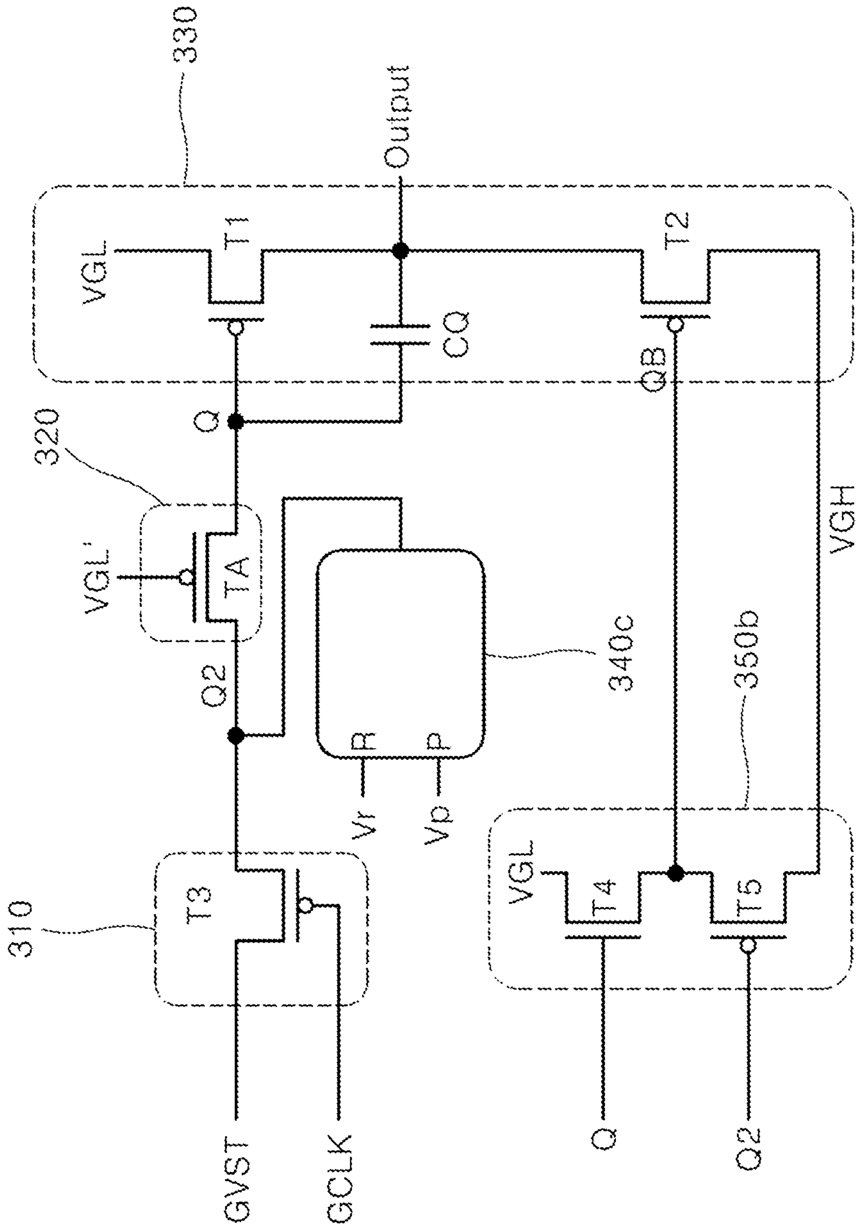
FIG. 6 is a configuration circuit diagram of any k-th stage STk in a gate shift register of a gate driver circuit according to a fourth embodiment of the present disclosure.

FIG. 6 is a configuration circuit diagram of any k-th stage STk in a gate shift register of a gate driver circuit according to a fourth embodiment of the present disclosure.

Referring to FIG. 6, the k-th stage STk in the gate shift register according to the fourth embodiment of the present disclosure may include the input unit 310, the Q node controller 320, the output unit 330, third voltage potential maintaining circuit 340*c* (also referred to as "third potential maintaining means 340*c*"), and the second QB node controller 350*b*.

That is, the k-th stage STk in the gate shift register according to the fourth embodiment of the present disclosure has a structure in which the first potential maintaining means 340 is replaced with the third potential maintaining means 340*c*, and the first QB node controller 350 is replaced with the second QB node controller 350*b*.

The third potential maintaining means 340*c* is connected to the Q2 node.

Each of the first potential maintaining means 340 and the second potential maintaining means 340*b* is connected to the Q node, while the third potential maintaining means 340*c* according to the fourth embodiment of the present disclosure is connected to the Q2 node.

In this regard, the third potential maintaining means 340*c* may include a thin-film transistor, a diode and a capacitor.

Further, the third potential maintaining means 340*c* may be connected to the driving signal (Vr) line and the application signal (Vp) line.

Figure 7:
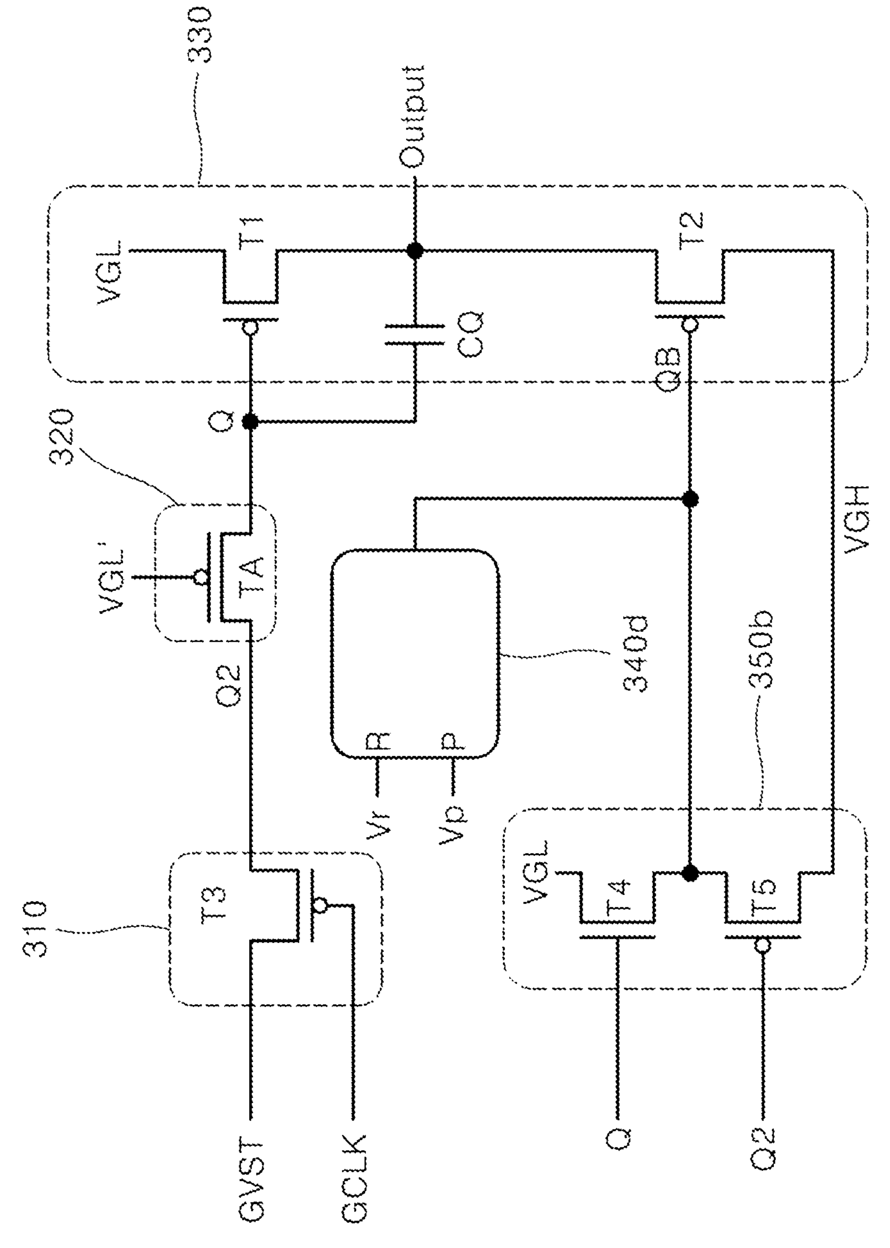
FIG. 7 is a configuration circuit diagram of any k-th stage STk in a gate shift register of a gate driver circuit according to a fifth embodiment of the present disclosure.

FIG. 7 is a configuration circuit diagram of any k-th stage STk in a gate shift register of a gate driver circuit according to a fifth embodiment of the present disclosure.

Referring to FIG. 7, the k-th stage STk in the gate shift register according to the fifth embodiment of the present disclosure may include the input unit 310, the Q node controller 320, the output unit 330, fourth voltage potential maintaining circuit 340*d* (also referred to as "fourth potential maintaining means 340*d*"), and the second QB node controller 350*b*.

That is, the k-th stage STk in the gate shift register according to the fifth embodiment of the present disclosure has a structure in which the first potential maintaining means 340 is replaced with the fourth potential maintaining means 340*d*, and the first QB node controller 350 is replaced with the second QB node controller 350*b*.

The fourth potential maintaining means 340*d* is connected to the QB node.

The fourth potential maintaining means 340*d* operates based on the driving signal Vr so as to maintain the potential of the QB node at a value below a selected (or predefined) level.

In this regard, the second QB node controller 350*b* has a structure in which one side thereof is connected to the output unit 330 through the QB node, and the other side thereof is connected to the output unit 330 through the gate-off signal (VGH) line.

Figure 8:
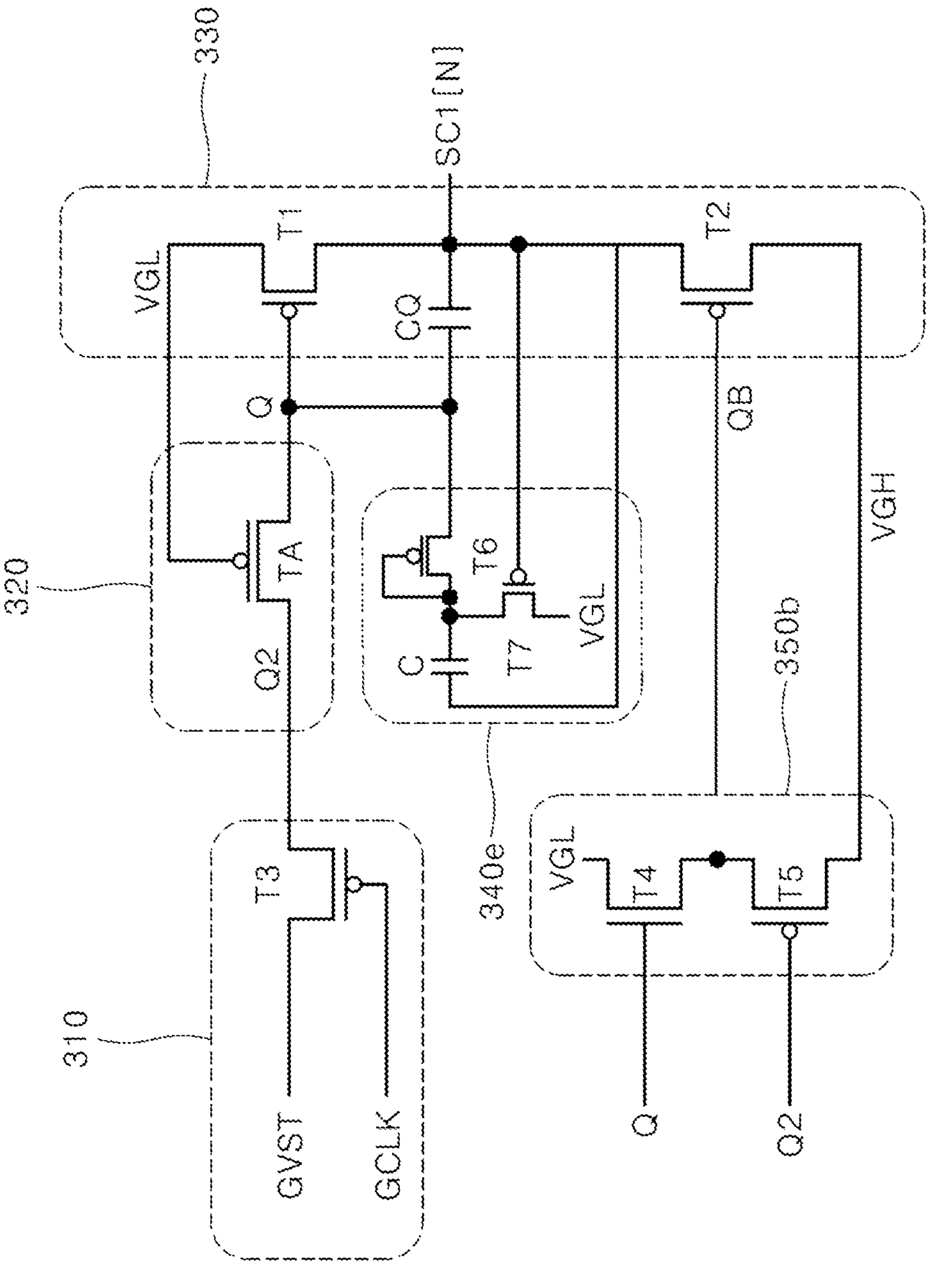
FIG. 8 is a configuration circuit diagram of any k-th stage STk in a gate shift register of a gate driver circuit according to a sixth embodiment of the present disclosure.

FIG. 8 is a configuration circuit diagram of any k-th stage STk in a gate shift register of a gate driver circuit according to a sixth embodiment of the present disclosure.

Referring to FIG. 8, the k-th stage STk in the gate shift register according to a sixth embodiment of the present disclosure may include the input unit 310, the Q node controller 320, the output unit 330, fifth potential maintaining circuit 340*e* (also referred to as "fifth potential maintaining means 340*e*"), and the second QB node controller 350*b*.

That is, the k-th stage STk in the gate shift register according to the sixth embodiment of the present disclosure has a structure in which the first potential maintaining means 340 is replaced with the fifth potential maintaining means 340*e*, and the first QB node controller 350 is replaced with the second QB node controller 350*b*.

One side of the fifth potential maintaining means 340*e* is connected to the Q node, and the other side thereof is connected to the output terminal Output of the output unit 330.

The fifth potential maintaining means 340*e* operates based on the light-emission signal EM(N) so as to maintain the potential of the Q node at a value below a selected (or predefined) level.

The fifth potential maintaining means 340*e* may include a sixth thin-film transistor T6 and a seventh thin-film transistor T7.

A first electrode of the sixth thin-film transistor T6 is connected to the Q node, a second electrode thereof is connected to the light-emission signal (EM(N)) line through the second capacitor C, and a gate electrode thereof is connected to the second electrode.

The seventh thin-film transistor T7 is configured such that a first electrode thereof is connected to the second electrode of the sixth thin-film transistor T6, a second electrode thereof is connected to the gate-on signal (VGL) line, and a gate electrode thereof is connected to the output terminal Output.

In this regard, the second QB node controller 350*b* has a structure in which one side thereof is connected to the output unit 330 through the QB node, and the other side thereof is connected to the output unit 330 through the gate-off signal (VGH) line.

Figure 9:
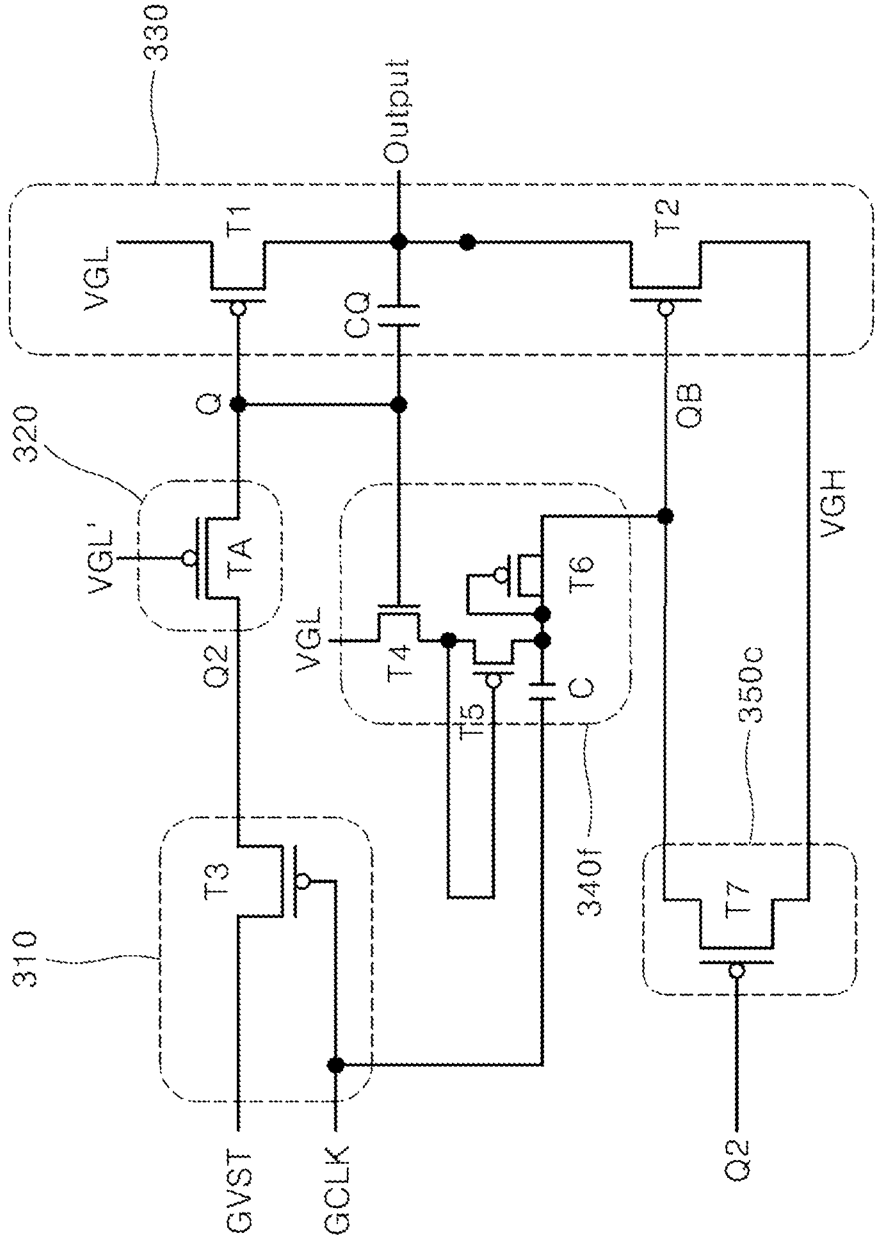
FIG. 9 is a configuration circuit diagram of any k-th stage STk in the gate shift register of a gate driver circuit according to a seventh embodiment of the present disclosure.

FIG. 9 is a configuration circuit diagram of any k-th stage STk in a gate shift register of a gate driver circuit according to a seventh embodiment of the present disclosure.

Referring to FIG. 9, the k-th stage STk in the gate shift register according to the seventh embodiment of the present disclosure may include the input unit 310, the Q node controller 320, the output unit 330, sixth potential maintaining circuit 340*f* (also referred to as "sixth potential maintaining means 340*f*"), and a third QB node controller 350*c*.

That is, the k-th stage STk in the gate shift register according to the seventh embodiment of the present disclosure has a structure in which the first potential maintaining means 340 is replaced with the sixth potential maintaining means 340*f*, and the first QB node controller 350 is replaced with the third QB node controller 350*c*.

In this regard, the sixth potential maintaining means 340*f* is configured such that one side thereof is connected to the Q node, another side thereof is connected to the QB node, and still another side thereof is connected to the input unit 310.

The sixth potential maintaining means 340*f* operates based on the voltage level of the Q node so as to maintain the potential of the Q node at a value below a selected (or predefined) level.

The sixth potential maintaining means 340*f* may include a fourth thin-film transistor T4, a fifth thin-film transistor T5, and a sixth thin-film transistor T6.

The fourth thin-film transistor T4 is configured such that a first electrode thereof is connected to the gate-on signal (VGL) line, a gate electrode thereof is connected to the Q node, and a second electrode thereof is connected to the fifth thin-film transistor T5.

The fifth thin-film transistor T5 is configured such that a first electrode thereof is connected to the second electrode of the fourth thin-film transistor T4, a gate electrode thereof is connected to the first electrode, and a second electrode thereof is connected to the input unit 310 through the second capacitor C.

The sixth thin-film transistor T6 is configured such that a first electrode thereof is connected to the second electrode of the fifth thin-film transistor T5, a second electrode thereof is connected to the QB node, and a gate electrode thereof is connected to the first electrode.

The third QB node controller 350*c* has a structure in which one side thereof is connected to the output unit 330 through the QB node, and the other side thereof is connected to the output unit 330 through the gate-off signal (VGH) line.

The third QB node controller 350*c* may include a seventh thin-film transistor T7.

That is, the seventh thin-film transistor T7 is configured such that a first electrode thereof is connected to the QB node, a second electrode thereof is connected to the output unit 330 through the gate-off signal (VGH) line, and a gate electrode thereof is connected to the Q2 node.

Figure 10:
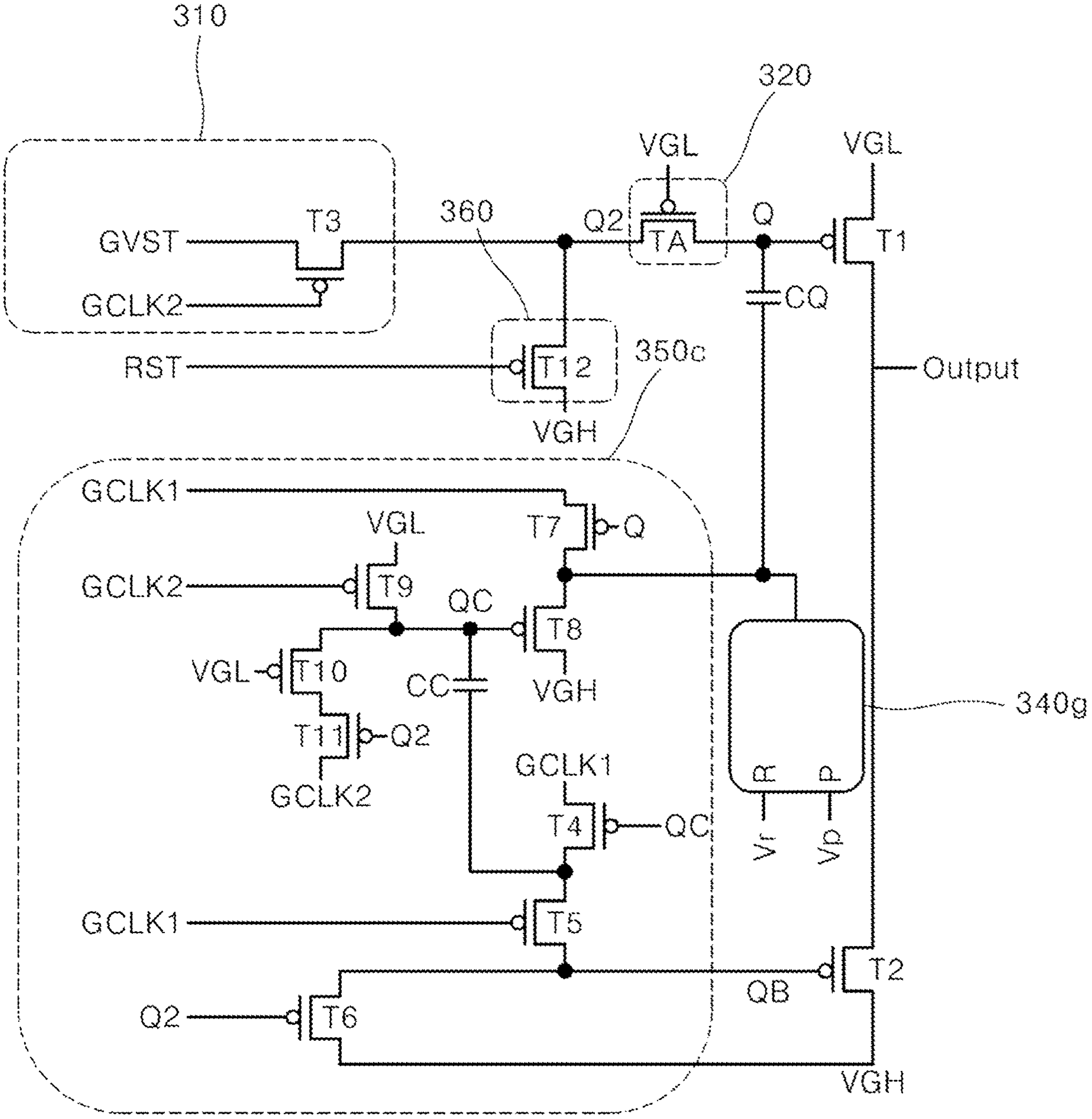
FIG. 10 is a configuration circuit diagram of any k-th stage STk in a gate shift register of a gate driver circuit according to an eighth embodiment of the present disclosure.

FIG. 10 is a configuration circuit diagram of any k-th stage STk in a gate shift register of a gate driver circuit according to an eighth embodiment of the present disclosure.

Referring to FIG. 10, the k-th stage STk in the gate shift register according to the eighth embodiment of the present disclosure may include the input unit 310, the Q node controller 320, the output unit 330, seventh voltage potential maintaining circuit 340*g* (also referred to as "seventh potential maintaining means 340*g*"), the third QB node controller 350*c* and a Q2 node controller 360.

That is, the k-th stage STk in the gate shift register according to the eighth embodiment of the present disclosure has a structure in which the first potential maintaining means 340 is replaced with the seventh potential maintaining means 340*g*, the first QB node controller 350 is replaced with the third QB node controller 350*c*, and the Q2 node controller 360 is further added.

In this regard, the seventh potential maintaining means 340*g* may be connected to the Q node, and may be connected to and disposed between the Q node and the third QB node controller 350*c*. Further, the driving signal (Vr) line and the application signal (Vp) line may be connected to the seventh potential maintaining means 340*g*. Moreover, the seventh potential maintaining means 340*g* is connected to the Q node through the first capacitor CQ.

The third QB node controller 350*c* may be connected to the seventh potential maintaining means 340*g* and may be connected to the gate electrode of the second thin-film transistor T2 of the output unit 330 through the QB node, and may be connected to the second electrode of the second thin-film transistor T2 of the output unit 330 through the gate high voltage (VGH) line.

The third QB node controller 350*c* may include a fourth thin-film transistor T4, a fifth thin-film transistor T5, a sixth thin-film transistor T6, a seventh thin-film transistor T7, an eighth thin-film transistor T8, a ninth thin-film transistor T9, a tenth thin-film transistor T10 and an eleventh thin-film transistor T11.

The fourth thin-film transistor T4 is configured such that a gate electrode thereof is connected to the CQ node, a first electrode thereof is connected to a first clock signal (GCLK1) line, and a second electrode thereof is connected to a first electrode of the fifth thin-film transistor T5.

The fifth thin-film transistor T5 is configured such that the first electrode thereof is connected to the second electrode of the fourth thin-film transistor T4, a gate electrode thereof is connected to the first clock signal (GCLK1) line, and a second electrode thereof is connected to the QB node.

In this regard, a connection point between the second electrode of the fourth thin-film transistor T4 and the first electrode of the fifth thin-film transistor T5 is connected to the CQ node through the second capacitor CC.

The sixth thin-film transistor T6 is configured such that a gate electrode thereof is connected to the Q2 node, a first electrode thereof is connected to the QB node, and a second electrode thereof is connected to the output unit 330 through the gate-off signal (VGH) line.

The seventh thin-film transistor T7 is configured such that a gate electrode thereof is connected to the Q node, a first electrode thereof is connected to the first clock signal (GCLK1) line, and a second electrode thereof is connected to the seventh potential maintaining means 340*g* and a first electrode of the eighth thin-film transistor T8.

The eighth thin-film transistor T8 is configured such that a first electrode thereof is connected to the second electrode of the seventh thin-film transistor T7, and the seventh potential maintaining means 340*g*, a gate electrode thereof is connected to a CQ node, and a second electrode thereof is connected to the gate-off signal (VGH) line.

The ninth thin-film transistor T9 is configured such that a first electrode thereof is connected to the gate-on signal (VGL) line, a gate electrode thereof is connected to a second clock signal (GCLK2) line, and a second electrode thereof is connected to the CQ node, and the first electrode of the tenth thin-film transistor T10.

The tenth thin-film transistor T10 is configured such that a first electrode thereof is connected to the second electrode of the ninth thin-film transistor T9, a gate electrode thereof is connected to the gate-on signal (VGL) line, and a second electrode thereof is connected to a first electrode of the eleventh thin-film transistor T11.

The eleventh thin-film transistor T11 is configured such that a first electrode thereof is connected to the second electrode of the tenth thin-film transistor T10, a gate electrode thereof is connected to the Q2 node, and a second electrode thereof is connected to the second clock signal (GCLK2) line.

The Q2 node controller 360 may include a twelfth thin-film transistor T12. The twelfth thin-film transistor T12 has a gate electrode connected to a reset signal (RST) line, a first electrode connected to the Q2 node, and a second electrode connected to the gate-off signal (VGH) line.

Figure 11:
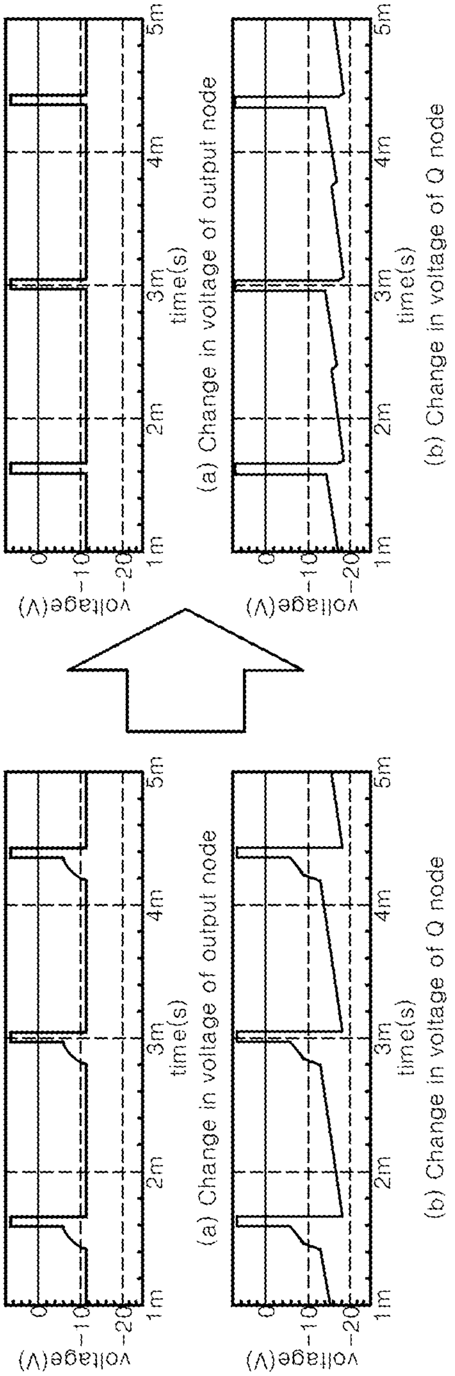
FIG. 11 is a graph showing voltage change of each of an output node and a Q node in a gate shift register of a gate driver circuit according to an embodiment of the present disclosure.

FIG. 11 is a graph showing change in a voltage of each of the output node and the Q node in the gate shift register of the gate driver circuit according to an embodiment of the present disclosure.

Referring to FIG. 11, regarding any k-th stage STk in the gate shift register of the gate driver circuit 140 according to an embodiment of the present disclosure, in a conventional case where the potential maintaining means 340 is not connected to the Q node or the Q2 node, an output-rise causing voltage is generated in the Q node (b), and thus an output error occurs in the voltage of the output node Output (a).

However, in any k-th stage STk in the gate shift register according to an embodiment of the present disclosure in which the potential maintaining means 340 is connected to the Q node or the Q2 node, an output-rise causing voltage as generated in the Q node is lower than a selected (or predefined) level (b), and thus no output error occurs in the voltage of the output node Output (a).

Figure 12:
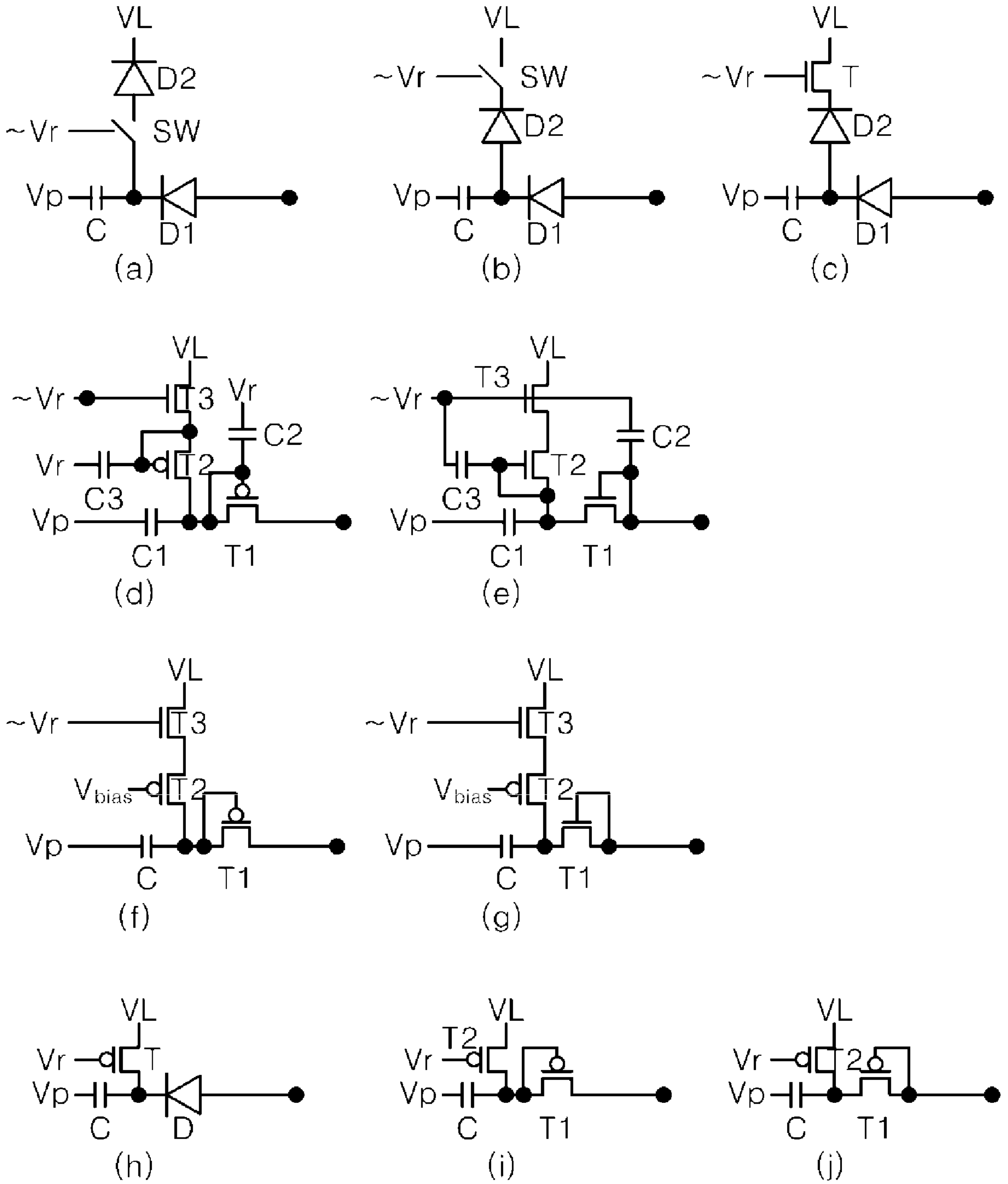
FIG. 12 is a diagram showing various structures of voltage potential maintaining circuits for supplying negative charges according to a ninth embodiment of the present disclosure.

FIG. 12 is a diagram showing various structures of the voltage potential maintaining circuit for supplying negative charges according to a ninth embodiment of the present disclosure.

Referring to FIG. 12, in the potential maintaining means according to the ninth embodiment of the present disclosure, as shown in (a), a first diode D1 may be connected to the application signal (Vp) line through a capacitor C, a second electrode of a switching element SW may be connected to a connection point between the first diode D1 and the application signal (Vp) line, and the low voltage (VL) line may be connected to a first electrode of the switching element SW through a second diode D2. A reverse driving signal (~Vr) line may be connected to a third electrode of the switching element SW. The first diode D1 has a forward direction toward the connection point, while the second diode D2 has a forward direction from the connection point to the low voltage (VL) line.

Further, in the potential maintaining means according to the ninth embodiment of the present disclosure, as shown in (b), a first diode D1 may be connected to the application signal (Vp) line through a capacitor C, and a second electrode of a switching element SW may be connected to a connection point between the first diode D1 and the application signal (Vp) line through a second diode D2. The low voltage (VL) line may be connected to a first electrode of the switching element SW. A reverse driving signal (~Vr) line may be connected to a third electrode of the switching element SW. The first diode D1 has a forward direction toward the connection point, while the second diode D2 has a forward direction from the connection point to the low voltage (VL) line.

Further, in the potential maintaining means according to the ninth embodiment of the present disclosure, as shown in (c), a first diode D1 may be connected to the application signal (Vp) line through a capacitor C, and a second electrode of an N-MOS thin-film transistor T may be connected to a connection point between the first diode D1 and the application signal (Vp) line through a second diode D2. The low voltage (VL) line may be connected to a first electrode of the N-MOS thin-film transistor T. A reverse driving signal (~Vr) line may be connected to a gate electrode of the N-MOS thin-film transistor T. The first diode D1 has a forward direction toward the connection point, while the second diode D2 has a forward direction from the connection point to the low voltage (VL) line.

Further, in the potential maintaining means according to the ninth embodiment of the present disclosure, as shown in (d), a first thin-film transistor T1 may be connected to the application signal (Vp) line through a first capacitor C1. A series of a second thin-film transistor T2 and a third thin-film transistor T3 may be connected to a connection point between the first thin-film transistor T1 and the application signal (Vp) line. Each of the first thin-film transistor T1 and the second thin-film transistor T2 has a P-MOS structure, and the third thin-film transistor T3 has an N-MOS structure. A gate electrode of the first thin-film transistor T1 may be connected to the driving signal (Vr) line through a second capacitor C2 and may be also connected to a connection point therebetween. The second thin-film transistor T2 is configured such that a second electrode thereof is connected to the connection point, a gate electrode thereof is connected to the driving signal (Vr) line through a third capacitor C3, and a first electrode thereof is connected to the gate electrode thereof, and to a second electrode of the third thin-film transistor T3. The third thin-film transistor T3 is configured such that a first electrode thereof is connected to the low voltage (VL) line, the second electrode thereof is connected to the first electrode of the second thin-film transistor T2, and a gate electrode thereof is connected to the reverse driving signal (~Vr) line.

Further, in the potential maintaining means according to the ninth embodiment of the present disclosure, as shown in (e), a first thin-film transistor T1 may be connected to the application signal (Vp) line through a first capacitor C1. A series of a second thin-film transistor T2 and a third thin-film transistor T3 may be connected to a first connection point between the first thin-film transistor T1 and the application signal (Vp) line. Each of the first thin-film transistor T1, the second thin-film transistor T2 and the third thin-film transistor T3 has an N-MOS structure. The first thin-film transistor T1 has a gate electrode and a first electrode connected to each other. A gate electrode of the third thin-film transistor T3 may be connected to a second connection point therebetween through a second capacitor C2. The second thin-film transistor T2 is configured such that a first electrode thereof is connected to the second electrode of the third thin-film transistor T3, a second electrode thereof is connected to the first connection point, and a gate electrode thereof is connected to the reverse driving signal (~Vr) line through the third capacitor C3 and to the second electrode thereof. The third thin-film transistor T3 is configured such that a first electrode thereof is connected to the low voltage (VL) line, a second electrode thereof is connected to the first electrode of the second thin-film transistor T2, and a gate electrode thereof is connected to the reverse driving signal (~Vr) line.

Further, in the potential maintaining means according to the ninth embodiment of the present disclosure, as shown in (f), a first thin-film transistor T1 may be connected to the application signal (Vp) line through a first capacitor C1, and a series of a second thin-film transistor T2 and a third thin-film transistor T3 may be connected to a connection point therebetween. Each of the first thin-film transistor T1 and the second thin-film transistor T2 has a P-MOS structure, and the third thin-film transistor T3 has an N-MOS structure. The first thin-film transistor T1 is configured such that a gate electrode and a second electrode thereof are connected to the connection point. The second thin-film transistor T2 is configured such that a first electrode thereof is connected to a second electrode of the third thin-film transistor T3, a second electrode thereof is connected to the connection point, and a gate electrode thereof is connected to a bias voltage (Vbias) line. The third thin-film transistor T3 is configured such that a first electrode thereof is connected to the low voltage (VL) line, a second electrode thereof is connected to the first electrode of the second thin-film transistor T2, and a gate electrode thereof is connected to the reverse driving signal (~Vr) line.

Further, in the potential maintaining means according to the ninth embodiment of the present disclosure, as shown in (g), a first thin-film transistor T1 may be connected to the application signal (Vp) line through a first capacitor C1, and a series of a second thin-film transistor T2 and a third thin-film transistor T3 may be connected to a connection point between the first thin-film transistor T1 and the application signal (Vp) line. Each of the first thin-film transistor T1 and the third thin-film transistor T3 has an N-MOS structure, and the second thin-film transistor T2 has a P-MOS structure. The first thin-film transistor T1 is configured such that a gate electrode and a first electrode thereof are connected to each other, and a second electrode thereof is connected to the connection point. The second thin-film transistor T2 is configured such that a first electrode thereof is connected to a second electrode of the third thin-film transistor T3, a second electrode thereof is connected to the connection point, and a gate electrode thereof is connected to the bias voltage (Vbias) line. The third thin-film transistor T3 is configured such that a first electrode thereof is connected to the low voltage (VL) line, a second electrode thereof is connected to the first electrode of the second thin-film transistor T2, and a gate electrode thereof is connected to the reverse driving signal (~Vr) line.

Further, in the potential maintaining means according to the ninth embodiment of the present disclosure, as shown in (h), a diode D may be connected to the application signal (Vp) line through a capacitor C, and a second electrode of a P-MOS thin-film transistor T may be connected to a connection point between the diode D and the application signal (Vp) line. The low voltage (VL) line may be connected to a first electrode of the P-MOS thin-film transistor T, and the driving signal (Vr) line may be connected to a gate electrode thereof. The diode D has a forward direction toward the connection point.

Further, in the potential maintaining means according to the ninth embodiment of the present disclosure, as shown in (i), a first thin-film transistor T1 may be connected to the application signal (Vp) line through a capacitor C, and a second thin-film transistor T2 may be connected to a connection point between the first thin-film transistor T1 and the application signal (Vp) line. Each of the first thin-film transistor T1 and the second thin-film transistor T2 has a P-MOS structure. The first thin-film transistor T1 has a gate electrode and a second electrode connected to the connection point. The second thin-film transistor T2 is configured such that a first electrode thereof is connected to the low voltage (VL) line, a second electrode thereof is connected to the connection point, and a gate electrode thereof is connected to the driving signal (Vr) line.

Further, in the voltage potential maintaining means according to the ninth embodiment of the present disclosure, as shown in (j), a first thin-film transistor T1 may be connected to the application signal (Vp) line through a capacitor C, and a second thin-film transistor T2 may be connected to a connection point between the first thin-film transistor T1 and the application signal (Vp) line. Each of the first thin-film transistor T1 and the second thin-film transistor T2 has a P-MOS structure. The first thin-film transistor T1 is configured such that a gate electrode and a first electrode thereof are connected to each other, and a second electrode thereof is connected to the connection point. The second thin-film transistor T2 is configured such that a first electrode thereof is connected to the low voltage (VL) line, a second electrode thereof is connected to the connection point, and a gate electrode thereof is connected to the driving signal (Vr) line.

The potential maintaining means 340 configured in various manner as described above may supply negative charges to the Q node or a specific node of the GIP. In this case, the potential maintaining means 340 may be configured to include a circuit acting as a diode, a capacitor, and a switch circuit. The diode provides a pass from the Q2 node that supplies the negative charge to the specific node. The capacitor is coupled to a negative edge of Vp so as to provide a pass that supplies negative charge to the Q2 node. The switch circuit is controlled to be turned on based on the Vr signal, such that when a voltage of the Q2 node is greater than a VL voltage, the voltage of the Q2 node may be set to be closer to the VL voltage.

When the negative charges are supplied from the potential maintaining means 340, signals of the driving signal (Vr) line and the low voltage (VL) line, and signals of the GIP are shown in Table 2 below.

TABLE 2

| Q node supply charge | Negative charge | Positive charge |
|---|---|---|
| GIP output signal | High (or Low) | Low (or High) |
| Negative CP operation | CP operation | Charge supply and reset stop |
| Negative CP reset switch operation | On | Off |
| Vr voltage example FIG. 12 (h) | Low (VGL) | High (VGH) |
| VL voltage | Low (VGL) | Don't Care (Low or High) |

Figure 13:
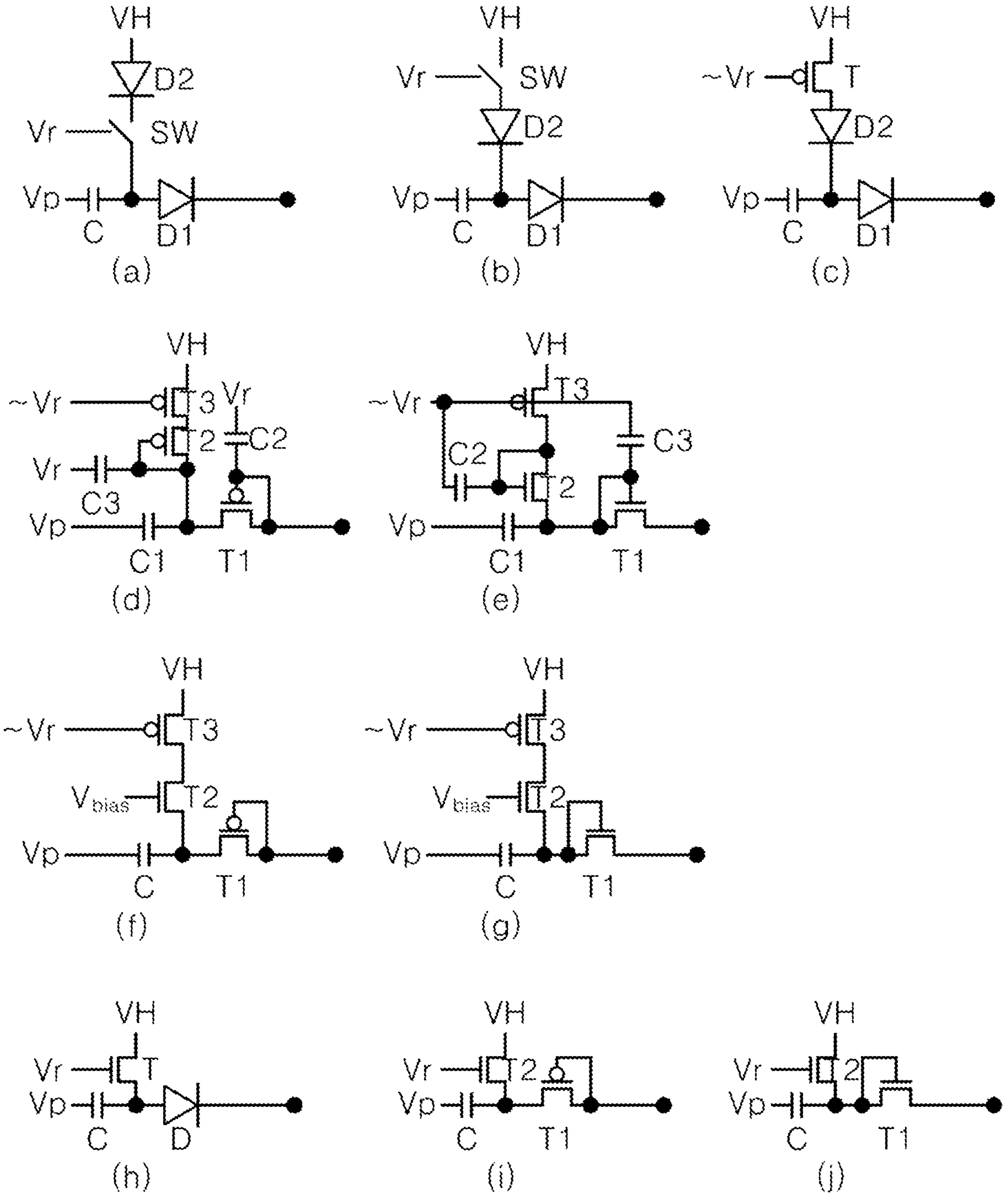
FIG. 13 is a diagram showing various structures of voltage potential maintaining circuits for supplying positive charges according to a tenth embodiment of the present disclosure.

FIG. 13 is a diagram showing various structures of voltage potential maintaining means for supplying positive charges according to a tenth embodiment of the present disclosure.

Referring to FIG. 13, in the potential maintaining means according to the tenth embodiment of the present disclosure, as shown in (a), a first diode D1 may be connected to the application signal (Vp) line through a capacitor C, a second electrode of a switching element SW may be connected to a connection point between the first diode D1 and the application signal (Vp) line, and a high voltage (VH) line may be connected to a first electrode of the switching element SW through a second diode D2. The driving signal (Vr) line may be connected to a third electrode of the switching element SW. The first diode D1 has a forward direction from the connection point to an outside, while the second diode D2 has a forward direction from the high voltage (VH) line to the connection point.

Further, in the potential maintaining means according to the tenth embodiment of the present disclosure, as shown in (b), a first diode D1 may be connected to the application signal (Vp) line through a capacitor C, and a second electrode of a switching element SW may be connected to a connection point between the first diode D1 and the application signal (Vp) line through a second diode D2. The high voltage (VH) line may be connected to a first electrode of the switching element SW. The driving signal (Vr) line may be connected to a third electrode of the switching element SW. The first diode D1 has a forward direction from the connection point to an outside, while the second diode D2 has a forward direction from the high voltage (VH) line to the connection point.

Further, in the potential maintaining means according to the tenth embodiment of the present disclosure, as shown in (c), a first diode D1 may be connected to the application signal (Vp) line through a capacitor C, and a second electrode of a P-MOS thin-film transistor T may be connected to a connection point between the first diode D1 and the application signal (Vp) line through a second diode D2. The high voltage (VH) line may be connected to a first electrode of the P-MOS thin-film transistor T. A reverse driving signal (~Vr) line may be connected to a gate electrode of the P-MOS thin-film transistor T. The first diode D1 has a forward direction from the connection point to an outside, while the second diode D2 has a forward direction from the high voltage (VH) line to the connection point.

Further, in the potential maintaining means according to the tenth embodiment of the present disclosure, as shown in (d), a first thin-film transistor T1 may be connected to the application signal (Vp) line through a first capacitor C1. A series of a second thin-film transistor T2 and a third thin-film transistor T3 may be connected to a first connection point between the first thin-film transistor T1 and the application signal (Vp) line. Each of the first thin-film transistor T1 and the second thin-film transistor T2 has a P-MOS structure, and the third thin-film transistor T3 has a P-MOS structure. A gate electrode of the first thin-film transistor T1 may be connected to the driving signal (Vr) line through a second capacitor C2 and may be also connected to a first electrode thereof. The second thin-film transistor T2 is configured such that a second electrode thereof is connected to the first connection point, and is connected to the driving signal (Vr) line through a third capacitor C3, a gate electrode thereof is connected to the second electrode thereof, and a first electrode thereof is connected to a second electrode of the third thin-film transistor T3. The third thin-film transistor T3 is configured such that a first electrode thereof is connected to the high voltage (VH) line, the second electrode thereof is connected to the first electrode of the second thin-film transistor T2, and a gate electrode thereof is connected to the reverse driving signal (~Vr) line.

Further, in the potential maintaining means according to the tenth embodiment of the present disclosure, as shown in (e), a first thin-film transistor T1 may be connected to the application signal (Vp) line through a first capacitor C1. A series of a second thin-film transistor T2 and a third thin-film transistor T3 may be connected to a first connection point between the first thin-film transistor T1 and the application signal (Vp) line. Each of the first thin-film transistor T1 and the second thin-film transistor T2 has an N-MOS structure and the third thin-film transistor T3 has a P-MOS structure. The first thin-film transistor T1 has a gate electrode and a second electrode connected to each other. The first connection point may be connected to a second connection point between the gate electrode and the second electrode of the first thin-film transistor T1. The gate electrode thereof is connected to the reverse driving signal (~Vr) line through a third capacitor C3. The second thin-film transistor T2 is configured such that a first electrode thereof is connected to a second electrode of the third thin-film transistor T3, a second electrode thereof is connected to the first connection point, and a gate electrode thereof is connected to the reverse driving signal (~Vr) line through a second capacitor C2 and to the first electrode thereof. The third thin-film transistor T3 is configured such that a first electrode thereof is connected to the high voltage (VH) line, a second electrode thereof is connected to the first electrode of the second thin-film transistor T2, and a gate electrode thereof is connected to the reverse driving signal (~Vr) line.

Further, in the potential maintaining means according to the tenth embodiment of the present disclosure, as shown in (f), a first thin-film transistor T1 may be connected to the application signal (Vp) line through a first capacitor C1, and a series of a second thin-film transistor T2 and a third thin-film transistor T3 may be connected to a connection point therebetween. Each of the first thin-film transistor T1 and the second thin-film transistor T2 has a N-MOS structure, and the third thin-film transistor T3 has a P-MOS structure. The first thin-film transistor T1 is configured such that a gate electrode and a second electrode thereof are connected to the connection point. The second thin-film transistor T2 is configured such that a first electrode thereof is connected to a second electrode of the third thin-film transistor T3, a second electrode thereof is connected to the connection point, and a gate electrode thereof is connected to a bias voltage (Vbias) line. The third thin-film transistor T3 is configured such that a first electrode thereof is connected to the high voltage (VH) line, a second electrode thereof is connected to the first electrode of the second thin-film transistor T2, and a gate electrode thereof is connected to the reverse driving signal (~Vr) line.

Further, in the potential maintaining means according to the tenth embodiment of the present disclosure, as shown in (g), a first thin-film transistor T1 may be connected to the application signal (Vp) line through a first capacitor C1, and a series of a second thin-film transistor T2 and a third thin-film transistor T3 may be connected to a connection point between the first thin-film transistor T1 and the application signal (Vp) line. Each of the first thin-film transistor T1 and the second thin-film transistor T3 has an N-MOS structure, and the third thin-film transistor T2 has a P-MOS structure. The first thin-film transistor T1 is configured such that a gate electrode and a second electrode thereof are connected to the connection point. The second thin-film transistor T2 is configured such that a first electrode thereof is connected to a second electrode of the third thin-film transistor T3, a second electrode thereof is connected to the connection point, and a gate electrode thereof is connected to the bias voltage (Vbias) line. The third thin-film transistor T3 is configured such that a first electrode thereof is connected to the high voltage (VH) line, a second electrode thereof is connected to the first electrode of the second thin-film transistor T2, and a gate electrode thereof is connected to the reverse driving signal (~Vr) line.

Further, in the potential maintaining means according to the tenth embodiment of the present disclosure, as shown in (h), a diode D may be connected to the application signal (Vp) line through a capacitor C, and a second electrode of a N-MOS thin-film transistor T may be connected to a connection point between the diode D and the application signal (Vp) line. The high voltage (VH) line may be connected to a first electrode of the N-MOS thin-film transistor T, and the driving signal (Vr) line may be connected to a gate electrode thereof. The diode D has a forward direction from the connection point to the outside.

Further, in the potential maintaining means according to the tenth embodiment of the present disclosure, as shown in (i), a first thin-film transistor T1 may be connected to the application signal (Vp) line through a capacitor C, and a second electrode of a second thin-film transistor T2 may be connected to a connection point between the first thin-film transistor T1 and the application signal (Vp) line. The first thin-film transistor T1 has a P-MOS structure and the second thin-film transistor T2 has a N-MOS structure. The first thin-film transistor T1 has a gate electrode and a first electrode connected to each other and a second electrode connected to the connection point. The second thin-film transistor T2 is configured such that a first electrode thereof is connected to the high voltage (VH) line, a second electrode thereof is connected to the connection point, and a gate electrode thereof is connected to the driving signal (Vr) line.

Further, in the potential maintaining means according to the tenth embodiment of the present disclosure, as shown in (j), a first thin-film transistor T1 may be connected to the application signal (Vp) line through a capacitor C, and a second electrode of a second thin-film transistor T2 may be connected to a connection point between the first thin-film transistor T1 and the application signal (Vp) line. Each of the first thin-film transistor T1 and the second thin-film transistor T2 has a N-MOS structure. The first thin-film transistor T1 is configured such that a gate electrode and a second electrode thereof are connected to the connection point. The second thin-film transistor T2 is configured such that a first electrode thereof is connected to the high voltage (VH) line, a second electrode thereof is connected to the connection point, and a gate electrode thereof is connected to the driving signal (Vr) line.

The potential maintaining means 340 configured in various manner as described above may supply positive charges to the Q node of the GIP. In this case, the potential maintaining means 340 may be configured to include a circuit acting as a diode, a capacitor, and a switch circuit. The diode provides a pass from the Q2 node that supplies the positive charge to a specific node. The capacitor is coupled to a positive edge of Vp so as to provide a pass that supplies positive charges to the Q2 node. The switch circuit is controlled to be turned on based on the Vr signal, such that when a voltage of the Q2 node is lower than a VL voltage, the voltage of the Q2 node may be set to be closer to the VL voltage.

When the positive charges are supplied from the potential maintaining means 340, signals of the driving signal (Vr) line and the low voltage (VL) line, and signals of the GIP are shown in Table 3 below.

TABLE 3

| Q node supply charge | Negative charge | Positive charge |
|---|---|---|
| GIP output signal | High (or Low) | Low (or High) |
| Positive CP operation | Charge supply and reset stop | CP operation |
| Positive CP reset switch operation | Off | On |
| Vr voltage example FIG. 13 (h) | Low (VGL) | High (VGH) |
| VL voltage | Don't Care (Low or High) | High (VGH) |

In one example, in the potential maintaining means 340, an application signal Vp that generates coupling through the capacitor is a pulse voltage and has a waveform that does not have a positive edge for a period for which a reset switch is opened.

Further, the application signal Vp has a waveform having at least one negative edge for a period for which the reset switch is shorted. A separate pulse waveform may be applied to one or more GIPs.

Further, the application signal Vp may employ an external application voltage (SC1, SC2, EM, GCLK (GCLK1, GCLK2) used in the GIP circuit, GIP_Start) as used in various GIPs present in the display panel. In particular, when a corresponding GIP in AMOLED is not an emission GIP, an emission control signal that controls OLED emission in the pixel may be applied to the Vp line.

Further, GIP outputs of stages before or after the GIP may be applied to the Vp line. Outputs of other GIPs used in the pixel may be applied to the Vp line.

Further, the potential maintaining means 340 may be implemented as several process elements such as LTPS, Oxide, and a-si, or may also be implemented as a process element corresponding to a combination of various processes.

Further, the potential maintaining means 340 may be applied to a scan driver of an active matrix display such as LCD, AMOLED, and QNED.

Moreover, the potential maintaining means 340 may be applied to electronic devices such as mobile phones, laptops, TVs, monitors, smart watches, and automobile displays including a display having a corresponding GIP including the potential maintaining means.

As described above, in the display device 100 according to the present disclosure, even when the low-speed operation is performed for a long time, the voltage of the Q node in each gate shift register of the gate driver circuit does not rise but is maintained at voltage below a selected (or predefined) level.

Therefore, according to an embodiment of the present disclosure, the output voltage at the output node of the gate shift register of the gate driver circuit 140 is not damaged due to leakage and noise during low-speed driving, thereby preventing image quality defect.

As described above, according to the present disclosure, a gate driver circuit and a display device including the same may be realized in which each gate shift register has the voltage potential maintaining means connected to the Q node between the input and the output thereof such that the voltage of the Q node is stably maintained at a value below a selected (or predefined) level even during the low-speed operation for a long time.

Although the embodiments of the present disclosure have been described in more detail with reference to the accompanying drawings, the present disclosure is not necessarily limited to these embodiments. The present disclosure may be implemented in various modified manners within the scope not departing from the technical idea of the present disclosure. Accordingly, the embodiments disclosed in the present disclosure are not intended to limit the technical idea of the present disclosure, but to describe the present disclosure. The scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display panel, comprising:

multiple stages selectively connected to lines to which multiple clock signals are supplied, wherein the multiple stages are configured to sequentially output a scan pulse, wherein each of the multiple stages includes:

an input unit electrically connected to each of a start signal line and a clock signal line;

a Q node controller electrically connected to the input unit through a Q2 node;

an output unit electrically connected to the Q node controller through a Q node;

a voltage potential maintaining circuit electrically connected to the Q node; and a QB node controller having one side electrically connected to the output unit through a QB node and the other side electrically connected to the output unit through a gate-off signal line, wherein the voltage potential maintaining circuit is configured to operate based on a driving signal and maintains a voltage potential of the Q node at a value below a selected level, wherein the output unit includes:

a pull-up transistor for outputting the scan signal to an output terminal based on a voltage level of the Q node; and a pull-down transistor for supplying a gate-off signal to the output terminal based on a voltage level of the QB node, wherein the pull-up transistor includes a first thin-film transistor having a gate electrode electrically connected to the Q node, a first electrode electrically connected to a gate-on signal line, and a second electrode electrically connected to the output terminal, wherein the pull-down transistor includes a second thin-film transistor having a gate electrode electrically connected to the QB node, a first electrode electrically connected to the output terminal, and a second electrode electrically connected to the gate-off signal line.

2. The display panel of claim 1, wherein a first capacitor is electrically connected to and disposed between the Q node to which the gate electrode of the first thin-film transistor is electrically connected and the output terminal to which the second electrode of the first thin-film transistor is electrically connected.

3. The display panel of claim 1, wherein the voltage potential maintaining circuit includes:

a seventh thin-film transistor having a gate electrode electrically connected to a driving signal line, a first electrode electrically connected to a low signal line, and a second electrode electrically connected to a contact point between the Q node and the first capacitor;

a diode electrically connected to and disposed between the contact point between the Q node and the first capacitor and the second electrode of the seventh thin-film transistor; and a second capacitor electrically connected to the second electrode of the seventh thin-film transistor, wherein an application signal line is electrically connected to the second electrode of the seventh thin-film transistor through the second capacitor.

4. The display panel of claim 1, wherein the input unit includes a third thin-film transistor having a gate electrode electrically connected to the clock signal line, a first electrode electrically connected to the start signal line, and a second electrode electrically connected to the Q2 node.

5. A display panel, comprising:

multiple stages selectively connected to lines to which multiple clock signals are supplied, wherein the multiple stages are configured to sequentially output a scan pulse, wherein each of the multiple stages includes:

an input unit electrically connected to each of a start signal line and a clock signal line;

a Q node controller electrically connected to the input unit through a Q2 node;

an output unit electrically connected to the Q node controller through a Q node;

a voltage potential maintaining circuit electrically connected to the Q node; and a QB node controller having one side electrically connected to the output unit through a QB node and the other side electrically connected to the output unit through a gate-off signal line, wherein the voltage potential maintaining circuit is configured to operate based on a driving signal and maintains a voltage potential of the Q node at a value below a selected level, wherein the Q node controller includes a TFT active-Anti-backflow (TA) thin-film transistor having a gate electrode electrically connected to a gate-on signal line, a first electrode electrically connected to the Q node, and a second electrode electrically connected to the Q2 node.

6. A display panel, comprising:

multiple stages selectively connected to lines to which multiple clock signals are supplied, wherein the multiple stages are configured to sequentially output a scan pulse, wherein each of the multiple stages includes:

an input unit electrically connected to each of a start signal line and a clock signal line;

a Q node controller electrically connected to the input unit through a Q2 node;

an output unit electrically connected to the Q node controller through a Q node;

a voltage potential maintaining circuit electrically connected to the Q node; and a QB node controller having one side electrically connected to the output unit through a QB node and the other side electrically connected to the output unit through a gate-off signal line, wherein the voltage potential maintaining circuit is configured to operate based on a driving signal and maintains a voltage potential of the Q node at a value below a selected level, wherein the QB node controller includes:

a fifth thin-film transistor having a first electrode electrically connected to the clock signal line, a gate electrode electrically connected to the clock signal line through a third capacitor, and a second electrode electrically connected to the QB node;

a fourth thin-film transistor having a gate electrode electrically connected to the start signal line, a first electrode electrically connected to the gate electrode of the fifth thin-film transistor, and a second electrode electrically connected to the output unit through the gate-off signal line; and a sixth thin-film transistor having a gate electrode electrically connected to the Q2 node, a first electrode electrically connected to the QB node, and a second electrode electrically connected to the output unit through the gate-off signal line.

* * * * *